(12) United States Patent
Arima et al.

(10) Patent No.: US 6,511,897 B2
(45) Date of Patent: Jan. 28, 2003

(54) METHOD OF MANUFACTURING SEMICONDUCTOR DEVICE AS WELL AS RETICLE AND WAFER USED THEREIN

(75) Inventors: Satoshi Arima, Hyogo (JP); Yoshikazu Kamitani, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/920,618

(22) Filed: Aug. 3, 2001

(65) Prior Publication Data

US 2002/0111028 A1 Aug. 15, 2002

(30) Foreign Application Priority Data

Feb. 13, 2001 (JP) ........................... 2001-034994

(51) Int. Cl.⁷ .................. H01L 21/46; H01L 21/78; H01L 21/301; H01L 21/302; H01L 21/461
(52) U.S. Cl. .................. 438/460; 438/463; 438/689
(58) Field of Search .................. 438/460, 463, 438/689

(56) References Cited

U.S. PATENT DOCUMENTS

| 5,124,927 | A | * | 6/1992 | Hopewell et al. ........ 250/491.1 |
| 5,175,128 | A | * | 12/1992 | Ema et al. ................... 430/312 |
| 5,607,818 | A | * | 3/1997 | Akram et al. ................ 204/478 |
| 6,093,511 | A | * | 7/2000 | Tanaka et al. ............ 250/491.1 |
| 6,093,943 | A | * | 7/2000 | Ikemasu et al. ............. 257/296 |
| 6,331,709 | B1 | * | 12/2001 | Amemiya et al. ........ 250/491.1 |
| 2002/0024671 | A1 | * | 2/2002 | Suzuki et al. ................ 356/401 |

FOREIGN PATENT DOCUMENTS

| JP | 10-154670 | 6/1998 |
| JP | 11-204525 | 7/1999 |

* cited by examiner

*Primary Examiner*—David Nelms
*Assistant Examiner*—Ly Duy Pham
(74) *Attorney, Agent, or Firm*—McDermott, Will & Emery

(57) ABSTRACT

A predetermined reticle is used for sequentially irradiating (giving a shot of) an exposure light onto a negative resist. In the negative resist the region irradiated with the exposure light remains as a resist pattern. The exposure light is not irradiated onto the negative resist in the wafer outer peripheral region. After that, a negative resist pattern is formed by carrying out a development process and, by using this as a mask, etching is carried out on the first conductive layer and, thereby, the first metal wire layer is formed. Since no resist pattern is formed in the wafer outer peripheral region, the first conductive layer does not remain. Thereby, a semiconductor device wherein a conductive layer is prevented from scattering off at the time of the dicing of the wafer can be gained.

7 Claims, 21 Drawing Sheets

METHOD OF MANUFACTURING SEMICONDUCTOR DEVICE AS WELL AS RETICLE AND WAFER USED THEREIN

BACKGROUND OF THE INVENTION

1. Field of the Invention

The present invention relates to a method of manufacturing a semiconductor device as well as a reticle and a wafer used therein, in particular to a method of manufacturing a semiconductor device wherein particles caused by cutting of a conductive layer are not scattered at the time of dicing during assembly, a reticle used in the exposure steps of this process and a wafer on which patterning is carried out in such a process.

2. Description of the Background Art

A conventional method of forming a pattern on a wafer by using photolithographic technology is described. A reticle is used in a photolithographic process for transcribing a predetermined pattern to a resist. As shown in FIG. 29, a plurality of chip pattern regions 121 are formed in a reticle 120 in order to form chip products.

In addition, dicing line pattern regions 122 are formed in order to partition the plurality of chip pattern regions 121. Moreover, peripheral dicing line pattern regions 123 and 124 are formed along the outer periphery of the reticle 120.

In the dicing line pattern regions 122, a mark for adjusting the alignment or a TEG (Test Element Group), for example, for testing the electrical characteristics are arranged. These dicing line pattern regions 122 and peripheral dicing line pattern regions 123 and 124 allow dicing line regions, which are necessary for cutting off a plurality of chip products, respectively, to be patterned onto a wafer.

The widths of the dicing line regions on the wafer are required to be the widths of several tens of a $\mu$m (for example, approximately 60 $\mu$m) at the minimum, taking into account the dispersion of the width of a cutter blade used for the dicing, the position of the cutter blade at the time of the dicing, or the like.

Here, the widths of the peripheral dicing line pattern regions 123 and 124 are set at the widths of two major types in order to make reduce the ratio (occupying ratio) of the dicing line regions in the wafer plane. In this case, the widths of the peripheral dicing line pattern regions 123a and 123b, which are positioned around the outer periphery of the adjoining two sides are set at a narrower width than the width of the peripheral dicing line pattern regions 124a and 124b positioned around the outer periphery of the other adjoining two sides. For example, the width of the peripheral dicing line pattern region 123a is several $\mu$m.

Next, exposure steps in the photolithographic process using the above reticle 120 are described. The reticle 120 is mounted in an exposure unit wherein an exposure light irradiates (is shot at) the resist formed on the wafer via the reticle 120 in sequence.

By means of one shot, a pattern corresponding to the reticle 120 is transcribed onto the wafer. Thereby, as shown in FIG. 30, the peripheral dicing line pattern region 123a part of the reticle 120 becomes a dicing line region 223a which has the width Xc. The peripheral dicing line pattern region 123b part becomes the dicing line region 223b which has the width Yc. The peripheral dicing line pattern region 124a part becomes the dicing line region 224a which has the width Ya. The peripheral dicing line pattern region 124b part becomes the dicing line region 224b which has the width Xa.

The dicing line pattern region 122a part becomes the dicing line region 222a which has the width Xb. The dicing line pattern region 122b part becomes the dicing line region 222b which has the width Yb.

Next, as shown in FIG. 30, the next shot is carried out at the position wherein the outer periphery of the dicing line region 224b, which corresponds to the peripheral dicing line pattern region 124b of the reticle 120, approximately agrees with the outer periphery of the dicing line region 223a resulting from the first shot.

At this time, the width of the peripheral dicing pattern region of the reticle 120, in particular, is set so that the width gained by combining the width of the dicing line region 223a, formed through the first shot, and the width of the dicing line region 224b, formed through the next shot, becomes approximately equal to the width Xb.

The same positional relationships are used for the exposure in the next shot and in the shot after that. Here, though in FIG. 30 only the X direction is shown, the same positional relationships are used for carrying out the exposure in the Y direction. In addition, the peripheral region of the wafer wherein a chip formation region is only partially formed through the first shot does not undergo exposure processing.

In this manner, by irradiating a wafer with an exposure light (by giving a shot of an exposure light to a wafer) in sequence, chip formation regions 102 and dicing line regions are formed in the wafer 101 as shown in FIG. 31. The conventional exposure steps are carried out in the above manner.

In the above described exposure method using the reticle 120, however, the problem arises as shown in the following. At the time of transcribing chip patterns onto a wafer, as shown in FIG. 30, the next shot is carried out under the positional relationships where the outer periphery of the dicing line region 224b, which corresponds to the peripheral dicing line pattern region 124b of the reticle 120, approximately agrees with the outer periphery of the dicing line pattern region 223a resulting from the first shot.

Therefore, regions which correspond, only, to the peripheral dicing line pattern region 123a are transcribed between, for example, the last chip formation regions 102a in the X direction and the wafer peripheral region P as shown in FIG. 31. The same conditions apply to the last chip formation regions 102b in the Y direction.

In addition, as described above, since the entire chip formation region is not formed in the wafer peripheral region P, the resist, which does not undergo exposure processing and is not patterned, remains in the wafer peripheral region P.

In the case that a predetermined etching process is carried out based on such exposure processing, a dicing line region D (223a), which corresponds, only, to the peripheral dicing line pattern region 123a, is formed between the chip formation region C (102a) and the wafer peripheral region P, as shown in FIG. 32.

Then, in the wafer peripheral region P, the film formed in each step is not patterned and remains in the unchanged condition.

As described above, as for the width of a dicing line region, generally the widths of several tens of a $\mu$m is required. As shown in FIG. 32, however, the width of the dicing line region D (223a) formed between the chip pattern region C (102a), positioned in the outermost periphery, and the wafer peripheral region P is approximately a few $\mu$m.

The dicing line region D is not formed with the sufficient width required for dicing. Therefore, in the dicing at the time of the actual assembly process as shown by the arrow 116, the wafer peripheral region P, practically, is diced.

On the other hand, the film formed in each step remains as it is in the wafer peripheral region P. Among these films, conductive films 111 and 113 made of aluminum, for example, for forming wires are included. Therefore, when this wafer peripheral region P is diced, the conductive films 111 and 113 are also diced so that particles, resulting from the cutting of the conductive films 111 and 113, are generated.

In the case that a wire bonding is carried out in the assembly process under the condition where the particles resulting from the cutting of the conductive films 111 and 113 are included in the system, in some cases wires form an electrical short circuit due to the scattered particles resulting from the cutting of the conductive films 111 and 113. Therefore, a chip product that is free of defects becomes a defective chip, which becomes a factor leading to a lowering of the yield of the products.

In addition, it also becomes the cause of the shortening of the longevity of the cutter since the blade of the cutter is damaged through dicing.

In order to deal with such a problem, measures are considered to ensure that the patterns are transcribed onto the entire surface of the wafer including the wafer peripheral region. On the other hand, as shown in FIG. 31, a wafer identifying mark 103 is created for distinguishing the wafer. This wafer identifying mark 1031 is formed by providing unevenness on the surface of the wafer through a laser blow.

Therefore, when the patterns are transcribed onto the entire surface of the wafer, the patterns are, also, formed in the wafer identifying mark 103 part and the disadvantage that the wafer cannot be identified because the wafer identifying mark 103 cannot be read out in the case that the wafer is sorted by a semiconductor production unit or in the wafer test (WT) process or the assembly process.

In addition, in the case that the patterns are formed on the entire surface of the wafer, the patterns which are formed in the wafer peripheral region, particularly, peel off and the peeled off patterns, by becoming attached to the wafer, become a factor causing a lowering of the yield.

In addition, a method can be considered wherein, by covering the dicing line pattern regions of the reticle using a blind function of the exposure unit (stepper unit), the patterns for these regions are not formed on the wafer.

In this case, however, it becomes necessary to adjust the position of the blind for some positions of the shots to the wafer so that the throughput is lowered.

According to the above, no effective methods to solve the above described problem have been found.

In addition, at the time of the cutting off, through dicing, of the chip formation regions formed in the wafer from each other, in some cases wires form an electrical short circuit due to the scattered particles resulting from the cutting of the marks, such as a conductive alignment mark formed in the dicing region.

SUMMARY OF THE INVENTION

The present invention is provided to solve the above problems and one purpose thereof is to provide a method of manufacturing a semiconductor device wherein the conductive films can be restricted from scattering at the time of the dicing of a wafer. Another purpose is to provide a reticle used in such a process for a semiconductor device. Still another purpose is to provide a wafer gained through such a process for a semiconductor device.

A method of manufacturing a semiconductor device according one aspect of the present invention has the step of forming a conductive layer on a wafer as a semiconductor substrate, the step of resist application, the step of exposure, the step of development and the step of forming a conductive region. In the step of resist application, a resist is applied to the conductive layer. In the step of exposure, an exposure light is sequentially irradiated onto a resist positioned on a plurality of chip formation regions for forming semiconductor chips, respectively, in the wafer via a predetermined reticle. In the step of development, a development process is carried out on the resist after the step of exposure and, thereby, a resist pattern for patterning the conductive layer is formed. Conductive regions are formed by applying etching to the conductive layer by using the resist pattern as a mask. The step of exposure includes the step of carrying out a predetermined processing of preventing the resist from remaining on the regions cut through by the dicing provided in the region outside of the chip formation regions positioned in the outermost periphery among the plurality of chip formation regions.

According to this method, a predetermined process is carried out so that the resist is prevented from remaining on the region cut in the dicing provided in the region outside of the chip formation regions positioned in the outermost periphery in the step of exposure. Thereby, the conductive layer is removed in the region cut in the dicing at the time of forming conductive regions by applying etching to the conductive layer. As a result, at the time when the region cut in the dicing is diced, there is no scattering of particles, resulting from the cutting of the conductive layer, so that an electrical short circuit formed by wires can be prevented from occurring at the time of wire bonding in the assembly process.

Preferably, a negative resist is used as a resist in the step of resist application and no exposure light is irradiated, according to a predetermined process, in the step of exposure onto the region outside of the chip formation regions positioned in the outermost periphery.

Thereby, no conductive layer remains in the region outside of the chip formation regions positioned in the outermost periphery. As a result, the particles resulting from the cutting of the conductive layer can be prevented from scattering at the time of the dicing of the region cut by dicing.

In addition, preferably, as a predetermined process in the step of exposure, after an exposure light is sequentially irradiated onto the resist positioned on the plurality of chip formation regions, a spot of an exposure light is irradiated along the border between the chip formation regions positioned in the outermost periphery and the region outside of those chip formation regions positioned in the outermost periphery.

Thereby, the resist pattern is not formed in the region cut by dicing and the conductive layer is removed. As a result, particles resulting from the cutting of the conductive layer can be prevented from scattering at the time of the dicing of the region cut by dicing.

More preferably, a dummy reticle wherein no pattern is formed in the region outside of the chip formation regions positioned in the outermost periphery, is used to carry out the exposure as a predetermined process in the step of exposure.

Thereby, the conductive layer does not remain in the chip formation regions positioned in the outermost periphery. As a result, particles resulting from the cutting of the conductive layer can be prevented from scattering at the time of the dicing of the region cut by dicing.

Preferably, as a predetermined process in the step of exposure, a reticle wherein a peripheral dicing line pattern region which has a pattern width required for securing the region to be cut by dicing is formed along the outer periphery is used as a predetermined reticle and, at the time when exposure is carried out in sequence using this reticle, exposure is carried out in the position where the peripheral dicing line pattern region according to one exposure and the peripheral dicing line pattern region according to the next exposure, carried out following this exposure, overlap, at least partially, in a plane.

Thereby, a plurality of chip formation regions can be arranged at predetermined intervals and, at the same time, a region which corresponds to the peripheral dicing line pattern regions is formed in the region cut by dicing provided in the region outside of the chip formation region positioned in the outermost periphery. In this corresponding region, the conductive layer is removed through etching and this corresponding region has the width necessary for securing the region to be cut dicing and, thereby, at the time of the dicing of this corresponding region as the region cut by dicing, particles resulting from the cutting of the conductive layer do not scatter off.

In addition, preferably, in the step of exposure, the peripheral dicing line pattern regions of the reticle are formed so as to have substantially the same width and exposure is carried out so that the peripheral dicing line pattern region resulting from one exposure and the peripheral dicing line pattern region resulting from the next exposure following this exposure are positioned so as to overlap almost completely in a plane.

In this case, a region with a greater width can be secured as the region corresponding to the peripheral dicing line pattern region and, thereby, at the time when this corresponding region is diced as the region cut by dicing, particles resulting from the cutting of the conductive layer can be prevented, without fail, from scattering off.

More preferably, no substantial pattern is formed in this peripheral dicing line pattern region.

Thereby, no patterns for marks such as an alignment mark made of a conductive layer is formed and, therefore, at the time of dicing particles resulting from the cutting of such a pattern do not scatter off.

A reticle according to another aspect of the present invention is a reticle used in the photolithographic process which includes a peripheral dicing line pattern region, that is formed along the outer periphery, for gaining the pattern width that is necessary for securing the region cut by dicing through one exposure.

This reticle is a reticle used in a process for a semiconductor device according to the present invention. In this structure, as described above, the conductive layer does not remain in the region cut by dicing so that particles resulting from the cutting of the conductive layer do not scatter off at the time of dicing.

Preferably, a plurality of chip pattern regions are provided for forming a semiconductor device and the plurality of chip pattern regions are partitioned from each other by dicing line pattern regions where the width of the dicing line pattern regions and the width of the peripheral dicing line pattern region are substantially the same width.

Thereby, as described above, the width of the regions cut by dicing is broadened so that particles resulting from the cutting of the conductive layer can be prevented, without fail, from scattering off at the time of dicing.

A first wafer according to still another aspect of the present invention includes a plurality of chip formation regions for forming semiconductor devices and the regions cut by dicing. The plurality of chip formation regions, which are partitioned from each other by the dicing line regions, are formed on the surface on the wafer. The regions cut by dicing are formed in the region outside of the chip formation regions positioned in the outermost periphery among the plurality of chip formation regions. Then, substantially, conductive regions are not provided, at least, in these regions cut by dicing so that, substantially, only insulating layers are positioned.

This wafer is a wafer gained through a process for a semiconductor device according to the present invention. In this structure, conductive regions are not, substantially, provided in the regions cut by dicing. As a result, particles resulting from the cutting of the conductive regions do not scatter off at the time of the dicing of these regions and wires can be prevented from forming an electrical short circuit at the time of wire bonding.

Preferably, substantially, only insulating layers are positioned in the region outside of the chip formation regions positioned in the outermost periphery.

Thereby, particles resulting from the cutting of the conductive regions can be prevented, without fail, from scattering off at the time of the dicing of the regions cut by dicing.

A second wafer according to still another aspect of the present invention, includes a plurality of chip formation regions for forming semiconductor devices as well as a plurality of pad electrodes and conductive regions. The plurality of chip formation regions for forming semiconductor devices are formed on the surface on the wafer and are partitioned from each other by the dicing line regions. The plurality of pad electrodes are formed in the chip formation regions and are arranged at predetermined intervals. The conductive regions are formed in the dicing line regions. Further, the dimensions of those conductive regions are smaller than the predetermined intervals.

In this structure, at the time of the dicing of the dicing line regions provided between the plurality of chip formation regions, though particles resulting from the cutting of the conductive regions provided in these dicing line regions scatter off, wires bonded to the neighboring pad electrodes can be prevented from forming an electrical short circuit created by the above particles resulting from the cutting because the sizes of these conductive regions are shorter than the intervals between the pad electrodes.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

A method of manufacturing a semiconductor device according to the first embodiment of the present invention and a wafer gained by the process are described. In this process a negative resist is used in a photolithographic process for a metal wire layer. The cross section structure of each step described herein, is show as the corresponding cross section structure along the cross section line V—V shown in FIG. 6.

Figure 1:
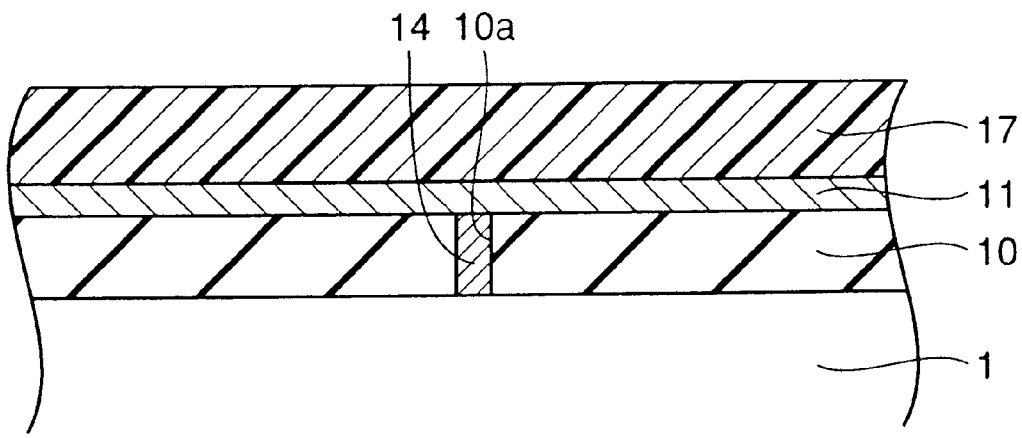
FIG. 1 is a cross section view along the cross section line V—V shown in FIG. 6 which shows one step of a process for a semiconductor device according to a first embodiment of the present invention.

First, as shown in FIG. 1, an interlayer insulating film 10 is formed on a silicon substrate (wafer) 1 through, for example, a CVD method. A contact hole 10a is created in the interlayer insulating film 10 so as to expose the surface of the silicon substrate 1. A plug 14 is formed in the contact hole 10a. A first conductive layer 11 is formed of aluminum, or the like, on the interlayer insulating film 10 through, for example, a sputtering method. A negative resist 17 is applied to and formed on the first conductive layer 11 as a resist.

Figure 2:
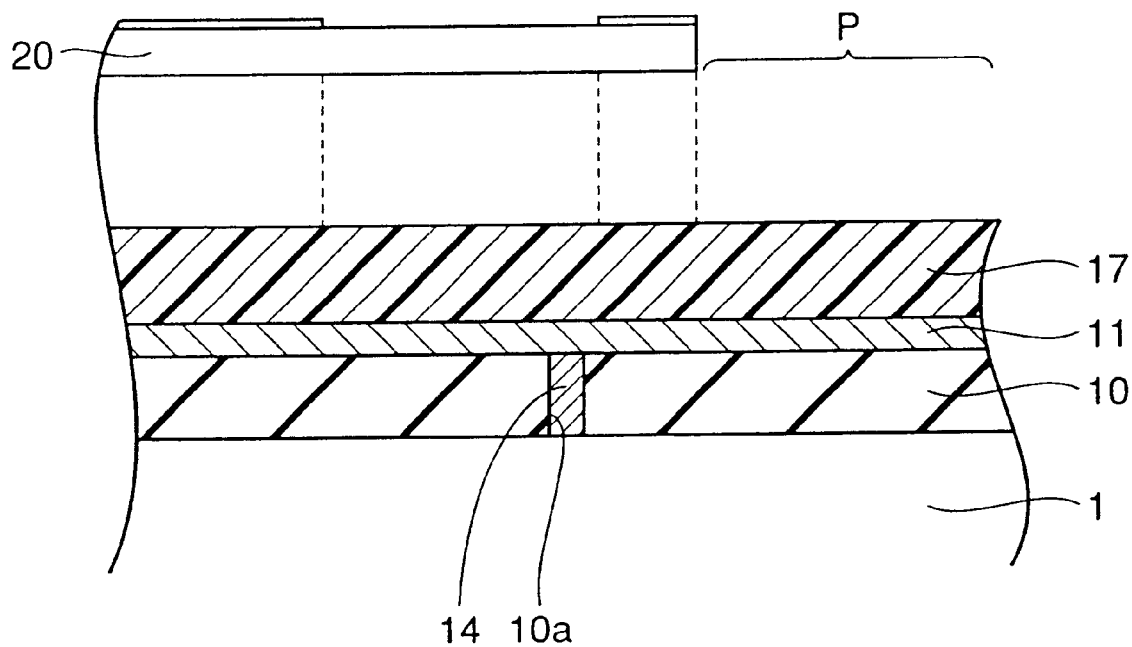
FIG. 2 is a cross section view showing the step which is carried out after the step shown in FIG. 1 in the first embodiment.

Next, as shown in FIG. 2, a predetermined reticle 20 for patterning the first conductive layer 11 is used to allow an exposure light to sequentially irradiate (give a shot to) the negative resist 17. In the negative resist 17, the region irradiated by the exposure light remains as the resist pattern.

No photolithographic process is carried out on the wafer outer periphery P, wherein a chip formation region can only be partially secured. That is to say, no exposure light irradiates the negative resist 17 in the wafer outer peripheral region P. Here, though not specifically shown, a lens (optical system) of the exposure unit is provided between the reticle and the silicon substrate 1.

Figure 3:
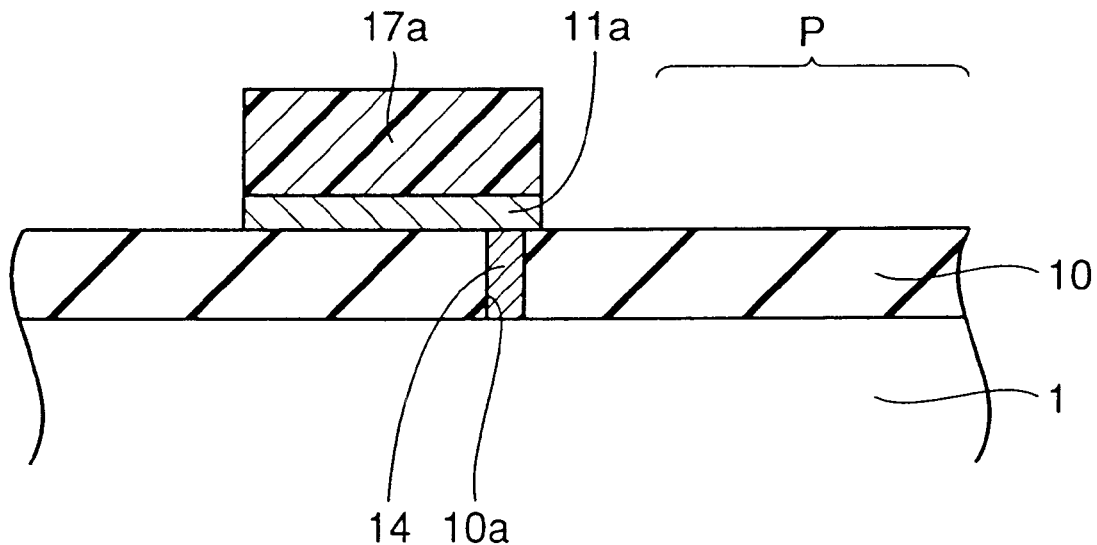
FIG. 3 is a cross section view showing the step which is carried out after the step shown in FIG. 2 in the first embodiment.

After that, as shown in FIG. 3, a negative resist pattern 17a is formed by carrying out a development process. By carrying out an anisotropic etching on the first conductive layer 11 using the resist pattern 17a as a mask, a first metal wire layer 11a is formed. At this time, since no resist pattern is formed in the wafer outer peripheral region P, etching is carried out on the first conductive layer 11 so that the first conductive layer 11 does not remain.

Figure 4:
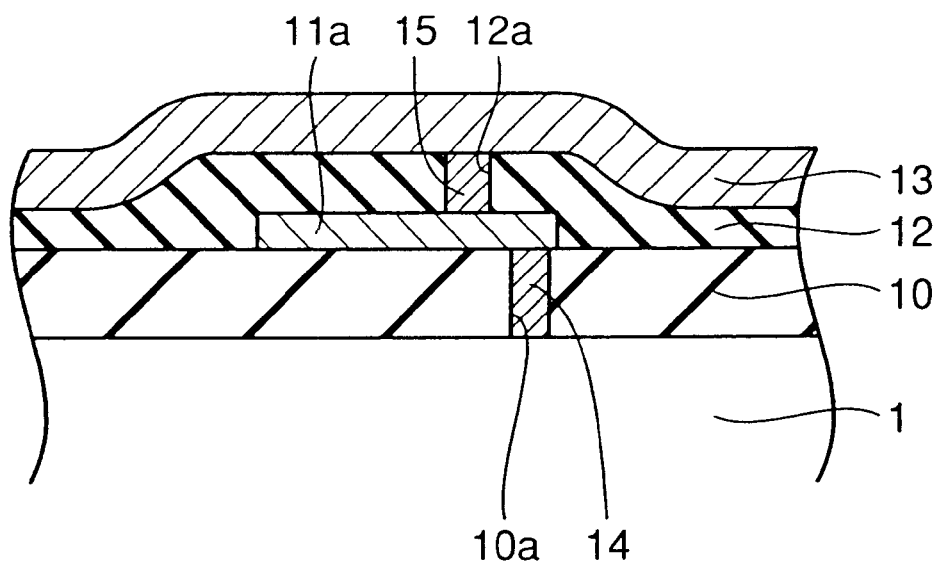
FIG. 4 is a cross section view showing the step which is carried out after the step shown in FIG. 3 in the first embodiment.

Next, as shown in FIG. 4, an interlayer insulating film 12 is further formed on the interlayer insulating film 10 so as to cover the first metal wire layer 11a. A contact hole 12a is created in the interlayer insulating film 12 so as to expose the surface of the first metal wire layer 11a. A plug 15 is formed in the contact hole 12a. A second conductive layer 13 is formed of aluminum, or the like, on the interlayer insulating film 12 through, for example, a sputtering method.

Figure 5:
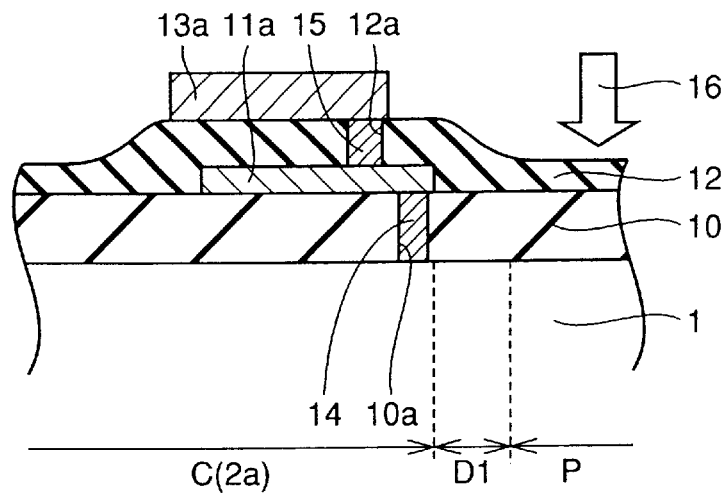
FIG. 5 is a cross section view showing the step which is carried out after the step shown in FIG. 4 in the first embodiment.

A photolithographic process is carried out on the second conductive layer 13 in the same manner as in the case of the first conductive layer 11 by using a negative resist and, thereby, a second metal wire layer 13a is formed as shown in FIG. 5. In this process, etching is carried out on the wafer outer peripheral region P by using a negative resist so that the second conductive layer 13 does not remain. In this manner, as shown in FIG. 6, chip formation regions 2 and dicing regions are formed on the wafer 1.

Figure 6:
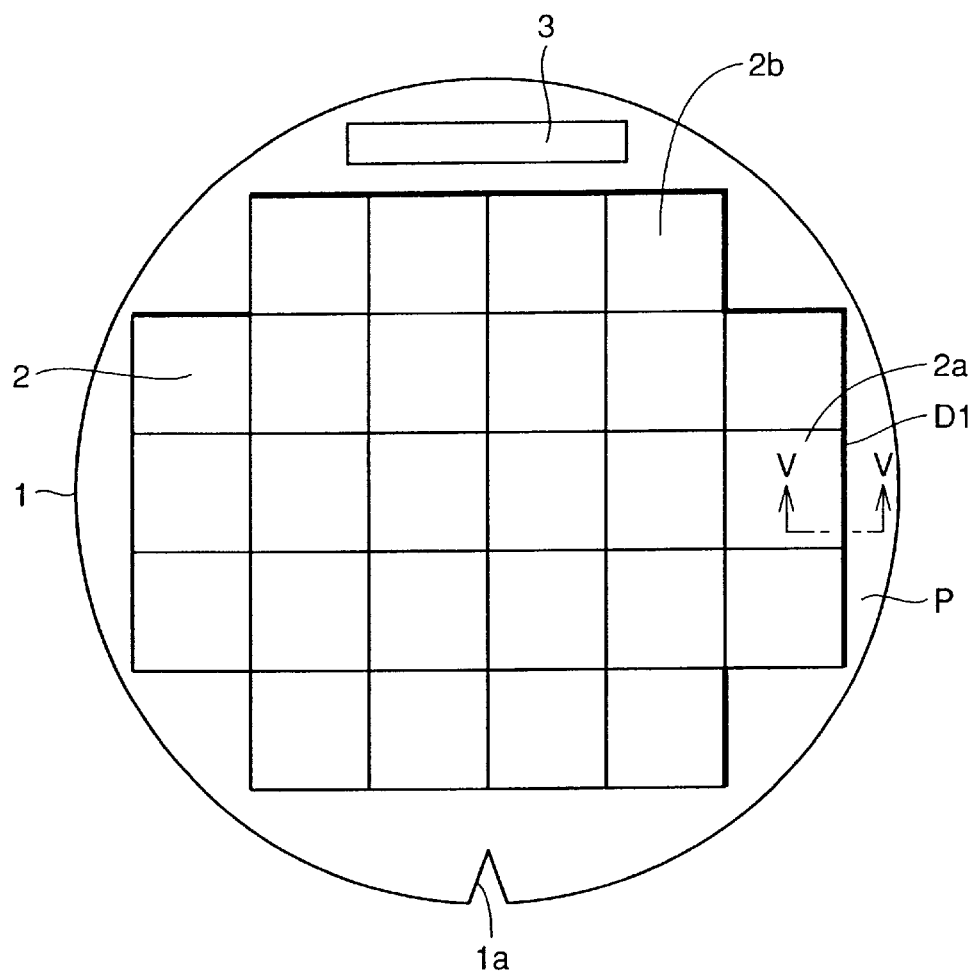
FIG. 6 is a plan view showing chip formation regions and dicing line regions formed in a wafer in the first embodiment.

Here, as shown in FIG. 6, a notch 1a is provided in the wafer 1 for showing the direction of the crystal axis. In addition, a wafer identification mark 3 is created on the wafer 1 for identifying the wafer.

Figure 29:
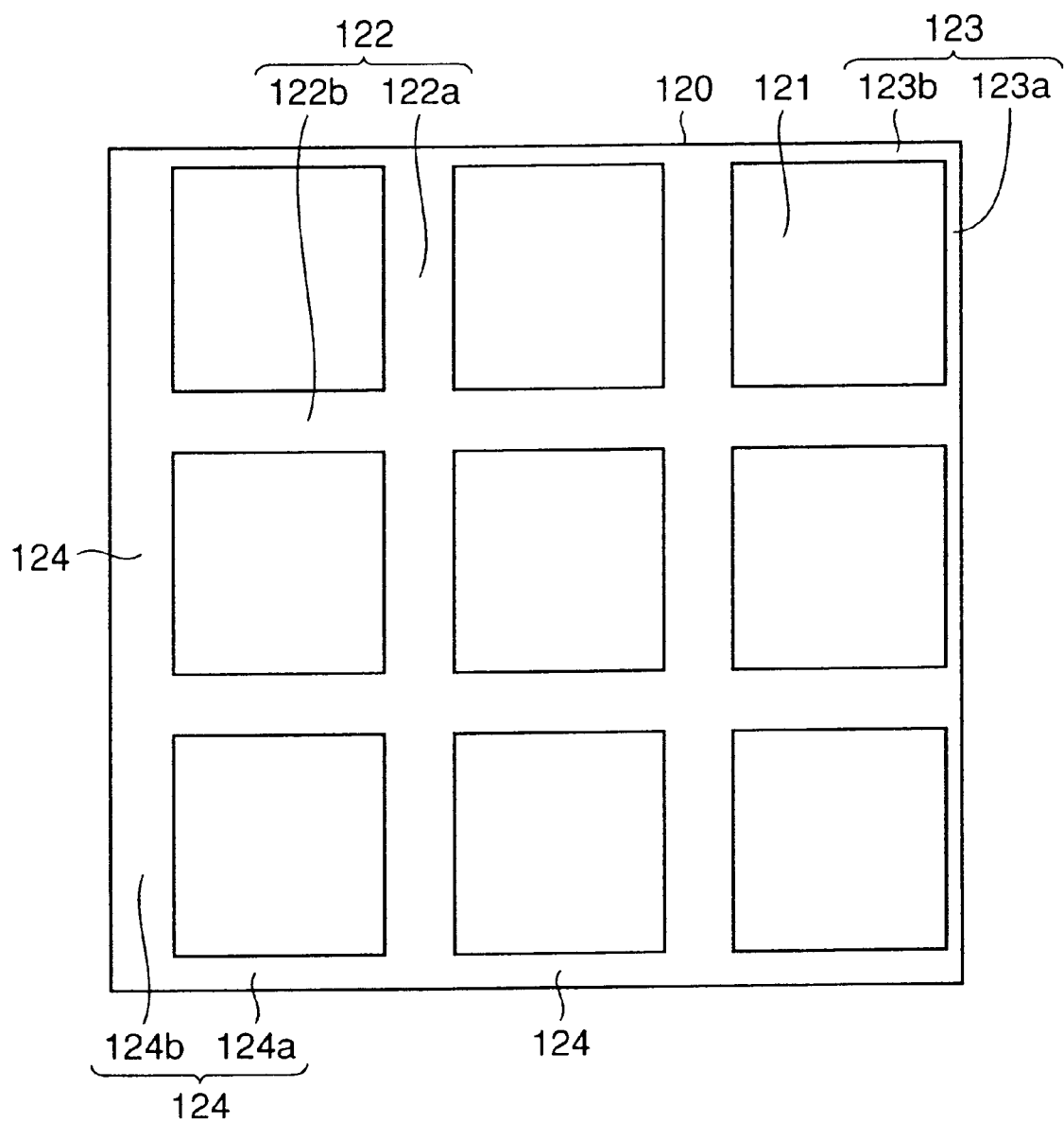
FIG. 29 is a plan view showing a reticle according to a prior art.
Figure 30:
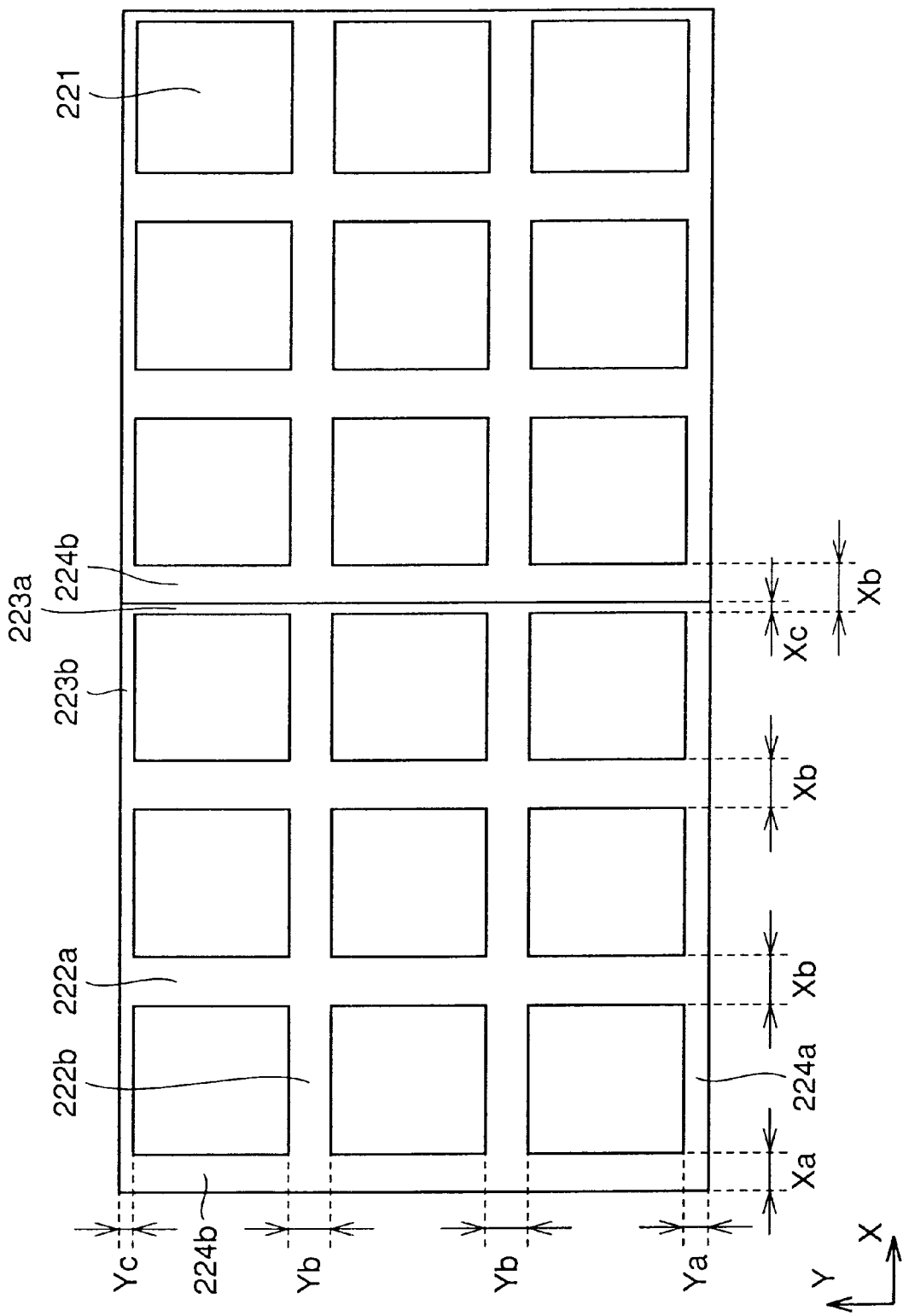
FIG. 30 is a plan view showing one step of a process for a semiconductor device using the reticle shown in FIG. 29.
Figure 31:
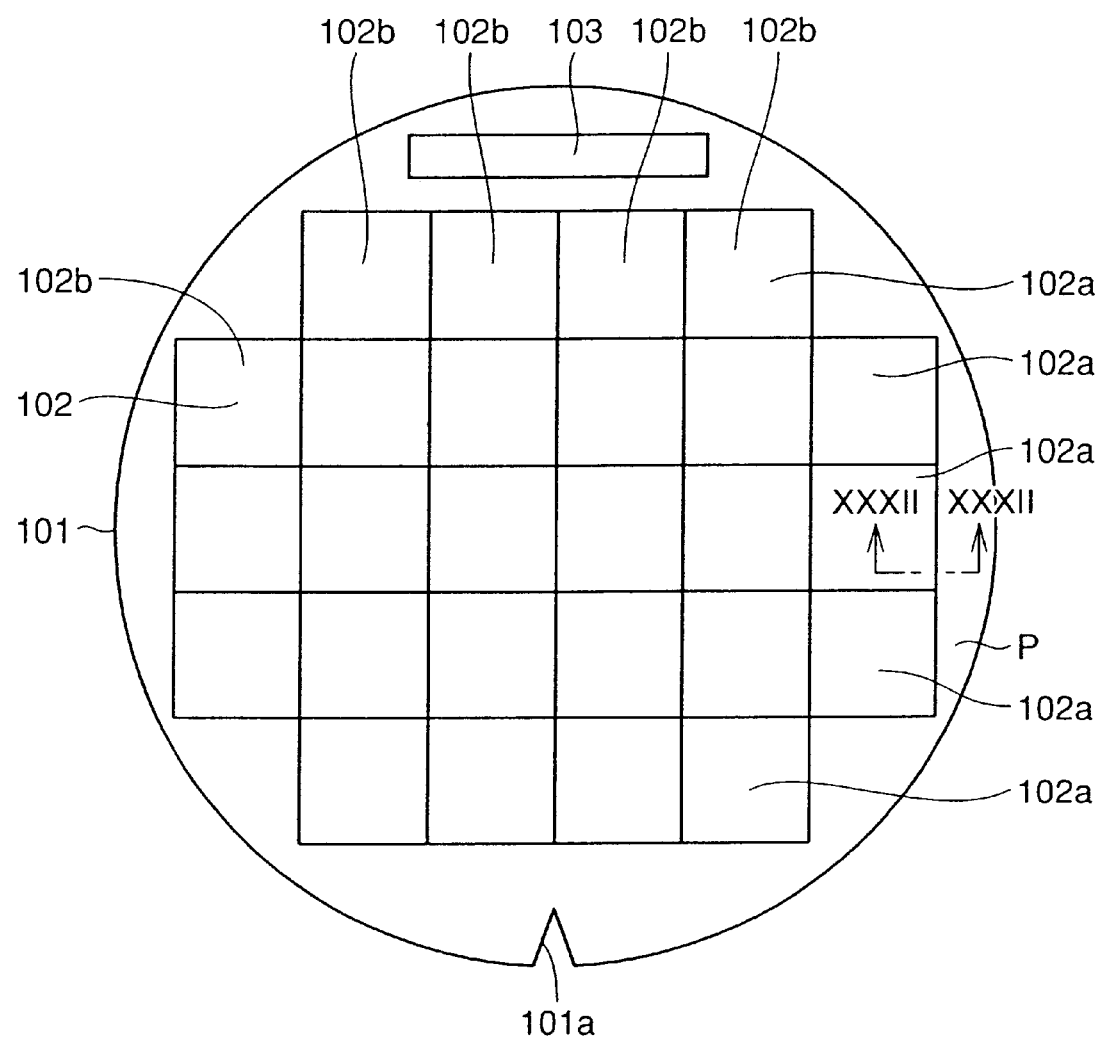
FIG. 31 is a plan view of a wafer showing the step which is carried out after the step shown in FIG. 30.
Figure 32:
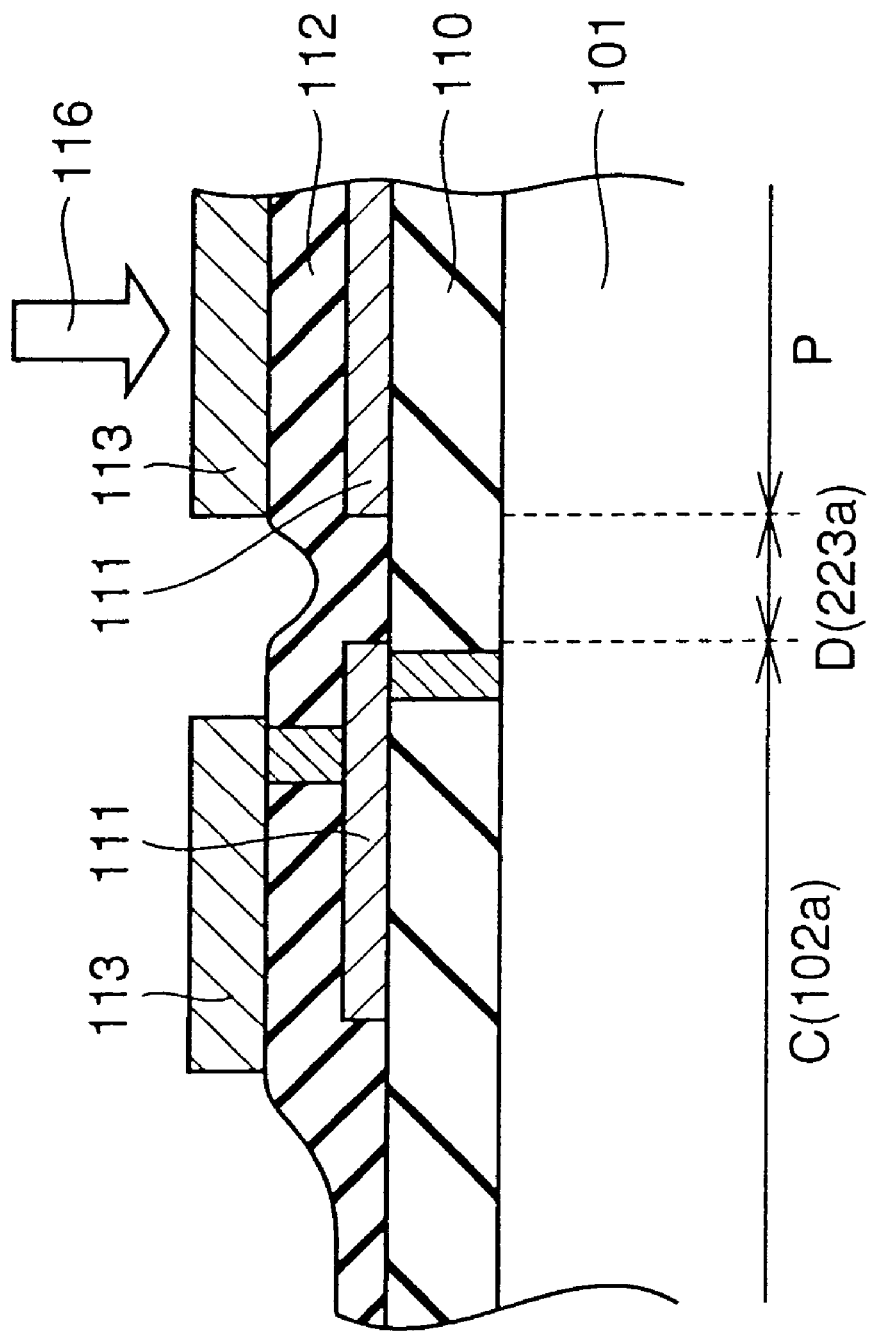
FIG. 32 is a cross section view along the cross section line XXXII—XXXII shown in FIG. 31.

In accordance with the above described process, even in the case that the width of the region D1, which is formed between the last chip formation region 2a in the X direction shown in FIG. 6 and the outer peripheral region P and which corresponds to the peripheral dicing line pattern region 123a of the reticle 120, does not have a width sufficient for dicing so that the wafer outer peripheral region P has to be, substantially, diced, such as in the case where a conventional reticle 120 as shown in FIG. 29 is used as a reticle 20, the first and the second conductive layers 11 and 13 do not remain in the region that is to be cut by dicing and, therefore, no particles resulting from the cutting of the first and second conductive layers 11 and 13 scatter off at the time of dicing.

This is described in slightly greater detail in the following. As described above, no exposure light irradiates the wafer outer peripheral region P outside of the chip formation region 2a and, therefore, the negative resist does not remain in the wafer outer peripheral region P due to the usage of a negative resist. Therefore, as shown in FIG. 5, etching is carried out in the wafer outer peripheral region P so that the first conductive layer 11 and the second conductive layer 13 do not remain. Here, the last chip formation region 2b in the Y direction shown in FIG. 6 and the outer peripheral region P are treated in the same manner as described above.

Thereby, even in the case that the wafer outer peripheral region P must be diced, as shown by the arrow 16, as a region to be cut by dicing, no particles resulting from the cutting of the first and second conductive layers 11 and 13 scatter off at the time of dicing since the first conductive layer 11 and the second conductive layer 13 do not remain in the outer peripheral region P.

As a result, at the time of wire bonding during the assembly process wires can be prevented from forming an electrical short circuit due to the particles resulting from the cutting of the first and second metal wires layers 11a and 13a which have scattered off causing a malfunction or defective chips can be prevented from occurring.

Second Embodiment

Figure 7:
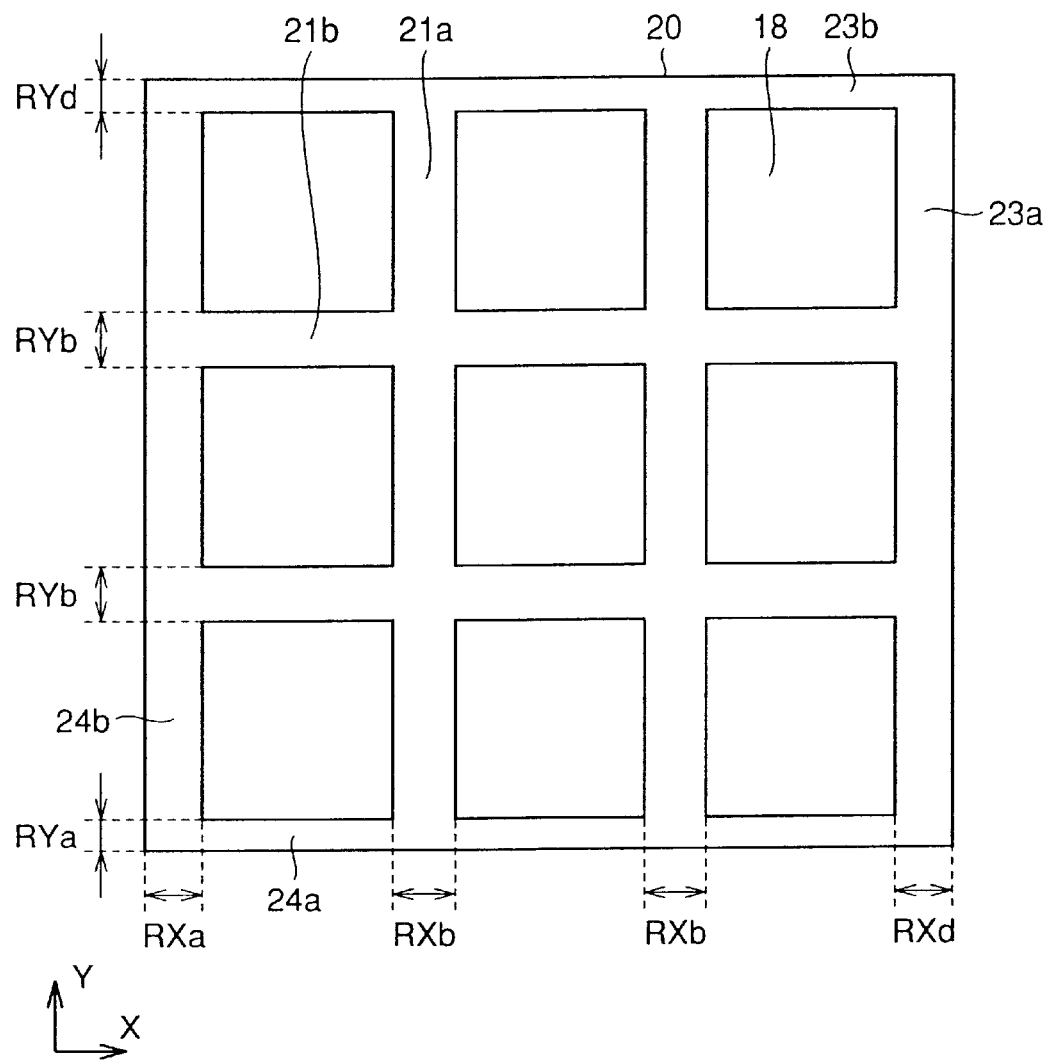
FIG. 7 is a plan view of a reticle used in a process for a semiconductor device according to a second embodiment of the present invention.

In the second embodiment, an example of a method of manufacturing a semiconductor device including a method of double exposure of the regions corresponding to the dicing lines in the exposure step is described. First, the reticle used in this method is described. As shown in FIG. 7, a reticle 20 is provided with a plurality of chip pattern regions 18, which are partitioned by dicing line pattern regions 21a, 21b, 23a, 23b, 24a and 24b.

As for these dicing line pattern regions, the width of the peripheral dicing line pattern regions 23a, which is positioned in the outermost periphery of the reticle 20, is set at RXd, the width of the peripheral dicing line pattern region 23b is set at RYd, the width of the peripheral dicing line pattern region 24a is set at RYa and the width of the peripheral dicing line pattern region 24b is set at RXa, respectively.

In addition, the width of the dicing line pattern region 21a, which is located between the chip pattern regions 18, is set at RXb and the width of the dicing line pattern region 21b is set at RYb, respectively.

In particular, in this reticle 20, the width of the peripheral dicing line pattern regions 23a, 23b, 24a and 24b, including the dicing line pattern regions 21a and 21b, is set so that the regions formed at the time of transcription onto the wafer have a width sufficient for dicing (several tens of a µm or more, for example, approximately 60 µm).

In addition, in this reticle 20, the above described respective widths are set so that the following relationships are gained.

$$RXb < RXa + RXd, \ RXb \geq RXa, \ RXd$$

$$RYb < RYa + RYd, \ RYb > RYa, \ RYd$$

Figure 8:
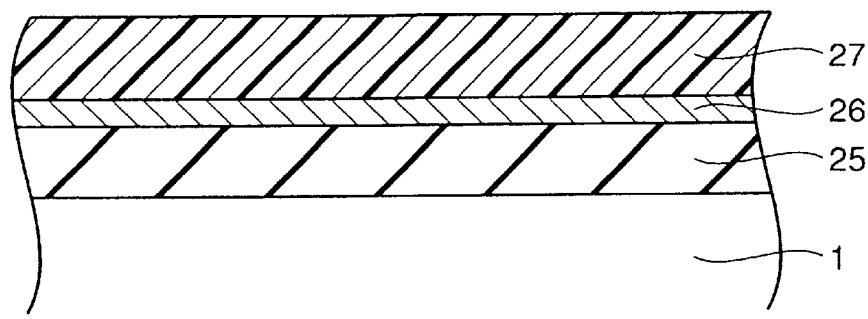
FIG. 8 is a cross section view showing one step of a process for a semiconductor device according to the second embodiment.

Next, a process for a semiconductor device using this reticle 20 is described. First, as shown in FIG. 8, an interlayer insulating film 25 is formed on the silicon substrate 1. A conductive layer 26 for forming a wire layer through, for example, a sputtering method is formed on the interlayer insulating film 25. A positive type resist 27 is applied to and formed on the conductive layer 26.

Figure 9:
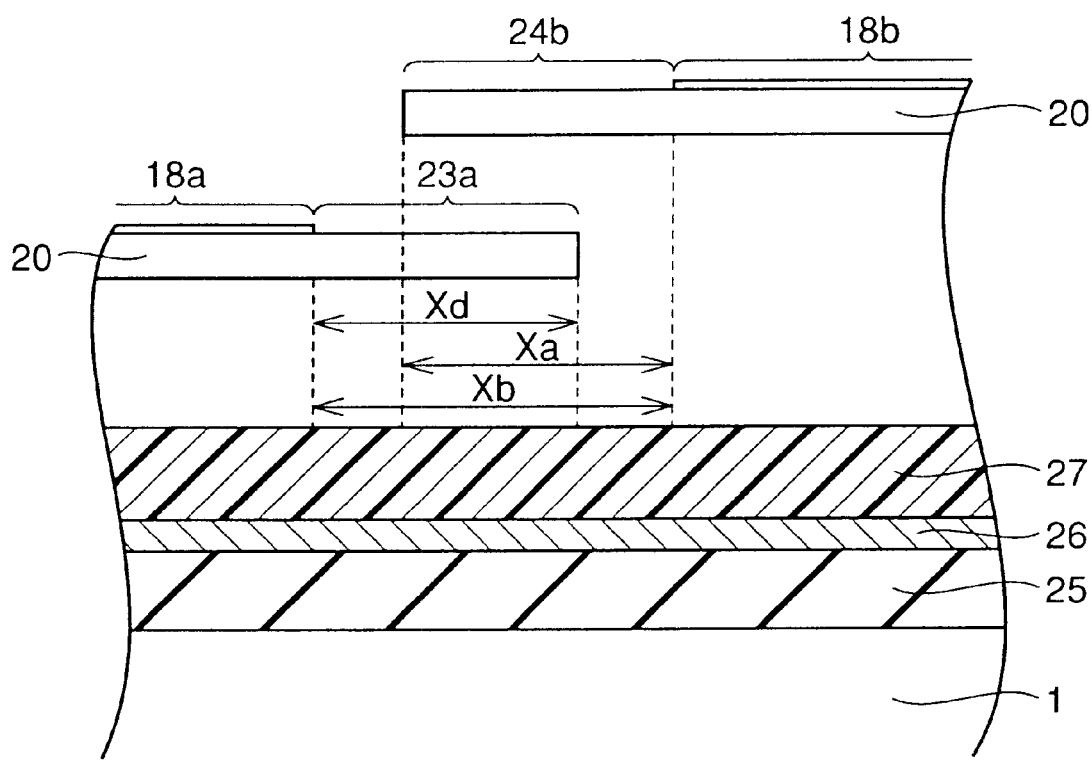
FIG. 9 is a cross section view showing the step which is carried out after the step shown in FIG. 8 in the second embodiment.

Next, an exposure light sequentially irradiates (is shot onto) the resist 27 formed on the wafer via the reticle 20 mounted on the exposure unit. At this time, as shown in FIG. 9, the exposures are sequentially carried out according to predetermined positional relationships between one shot and the next shot (for example, in the X direction) wherein the peripheral dicing line pattern region 24b of the reticle 20 resulting from the next shot partially overlaps, in a plane, the peripheral dicing line pattern region 23a of the reticle 20 resulting from the first shot.

Concretely, first, in the first shot, a region which has the width Xd is formed (transcribed) onto the wafer according to the peripheral dicing line pattern region 23a, formed in the reticle 20 having the width RXd.

In the next shot, a region which has the width Xa is formed (transcribed) onto the wafer according to the peripheral dicing line pattern region 24a, formed in the reticle 20 having the width RXa.

In addition, according to the dicing line pattern region 21a, formed in the reticle 20 having the width RXb, a region which has the width Xb is formed (transcribed) onto the wafer (not shown).

At this time, the exposure lights irradiate according to the relative positional relationships between the reticle 20 and the wafer (silicon substrate 1), wherein the gap, between chip formation regions formed (transcribed) by one shot onto the wafer according to the chip pattern regions 18a formed in the reticle 20 and the chip formation regions formed (transcribed) by the next shot onto the wafer according to the chip pattern regions 18b formed in the reticle 20, becomes substantially the same as the width Xb of the region formed (transcribed) onto the wafer according to the dicing line pattern region 21a formed in the reticle 20.

On the other hand, the length gained by adding the width RXd of the peripheral dicing line pattern region 23a and the width RXa of the peripheral dicing line pattern region 24a is longer than the width RXb of the dicing line pattern region 21a as shown in the above described expression. Therefore, in order to gain the above described positional relationships, the peripheral dicing line pattern region 24b needs to be set in the positional relationships where it partially overlaps, in a plane, the peripheral dicing line pattern region 23a as shown in FIG. 9. Though this description relates to the X direction, the same description is applicable to the Y direction.

Figure 10:
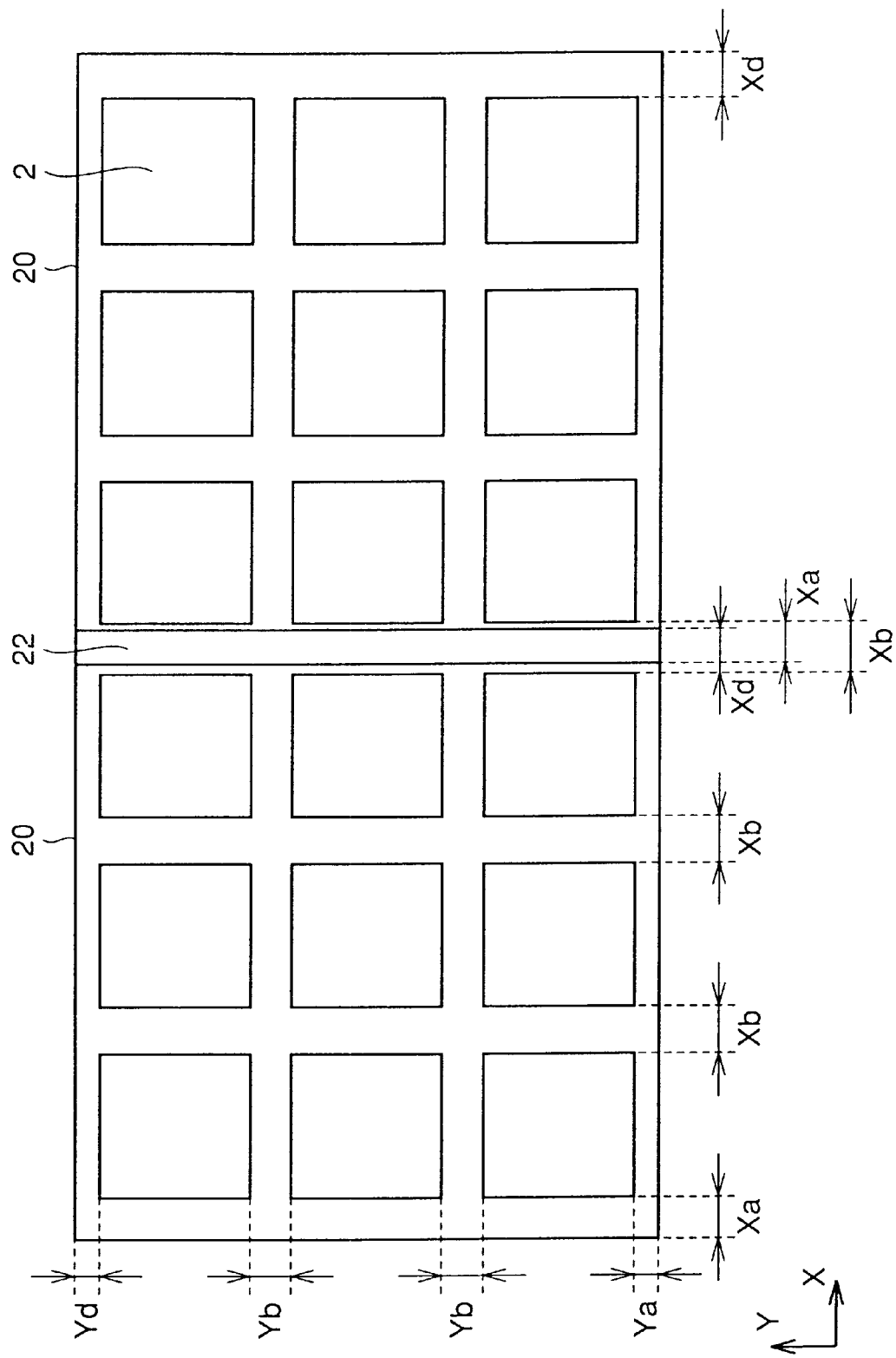
FIG. 10 is a plan view showing chip formation regions and dicing line regions formed in a wafer in the second embodiment.

According to such positional relationships between the wafer and the reticle, the exposure light sequentially irradiates the resist formed on the wafer so as to form the chip formation regions 2 and the dicing line regions on the wafer as shown in FIG. 10. A region 22, shown in FIG. 10, is a region which is irradiated twice by an exposure light (double exposure) according to positional relationships wherein the peripheral dicing line pattern regions partially overlap in a plane at the time of irradiation by an exposure light in one shot and the next shot, respectively.

Figure 11:
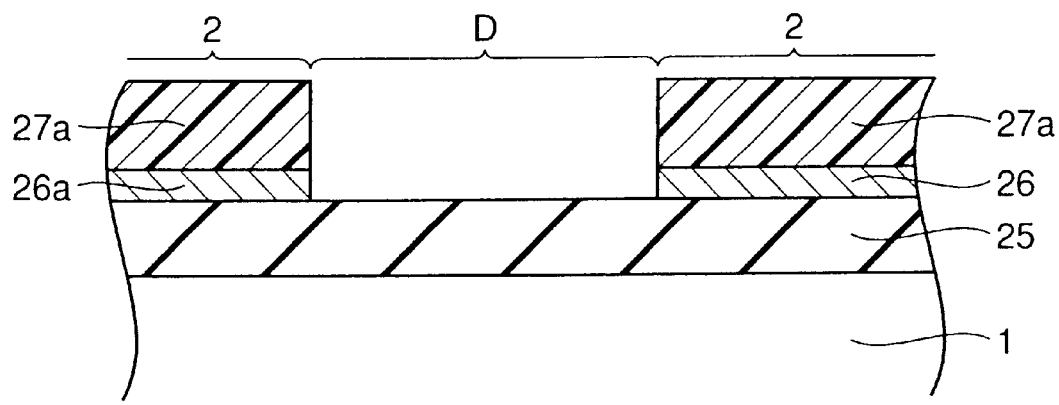
FIG. 11 is a cross section view showing the step which is carried out after the step shown in FIG. 9 in the second embodiment.

The parts irradiated by an exposure light do not have any remaining resist due to the positive type of the resist 27. Accordingly, through the development process, as shown in FIG. 11, the resist of the part corresponding to the region D, which has the width Xb, is removed so that the resist pattern 27a is formed. By carrying out etching on the conductive layer 26 using the resist pattern 27a as a mask, a wire layer 26a is formed. After that, the resist pattern 27a is removed.

Figure 12:
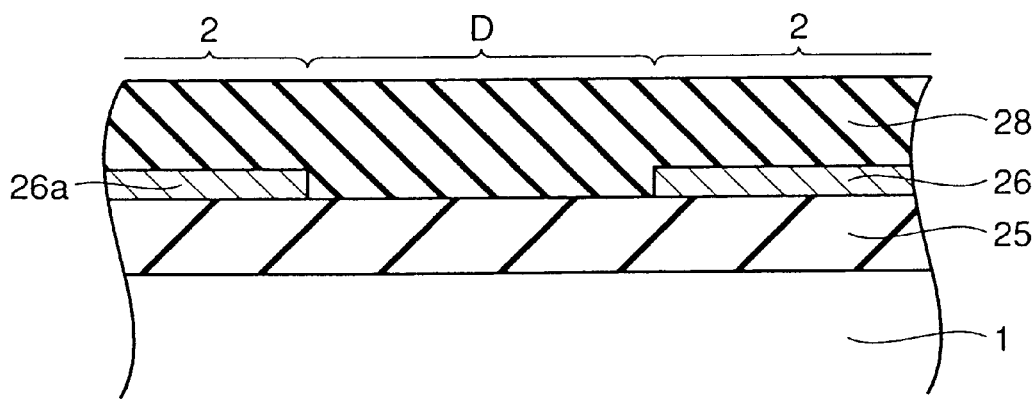
FIG. 12 is a cross section view showing the step which is carried out after the step shown in FIG. 11 in the second embodiment.

Next, as shown in FIG. 12, an interlayer insulating film 28 is formed so as to cover the wire layer 26a through, for example, a CVD method. In this manner, a semiconductor device is formed.

In the above described process for a semiconductor device, first an exposure light irradiates according to the positional relationships wherein the gap between the chip formation region formed on the wafer according to the chip pattern region 18a in one shot and the chip formation region formed on the wafer according to the chip pattern region 18b in the next shot becomes substantially the same as the width Xb of the region formed on the wafer according to the dicing line pattern region 21a.

Thereby, as shown in FIG. 12, the conductive layer 26 does not remains in the region D between the chip formation region formed on the wafer according to the chip pattern region 18a in one shot and the chip formation region formed on the wafer according to the chip pattern region 18b in the next shot. Accordingly, no particles resulting from the cutting of the conductive layer 26 scatter off at the time of dicing the two chip formation regions.

Then, as described above, the respective widths RXd, RYd, RYa and RXa of the peripheral dicing line pattern regions 23a, 23b, 24a and 24b, formed in the reticle 20 shown in FIG. 7, are set so that the widths of the regions formed (patterned) at the time of transcription of the peripheral dicing line pattern regions onto the wafer have a width sufficient for dicing (several tens of a μm or more).

Figure 13:
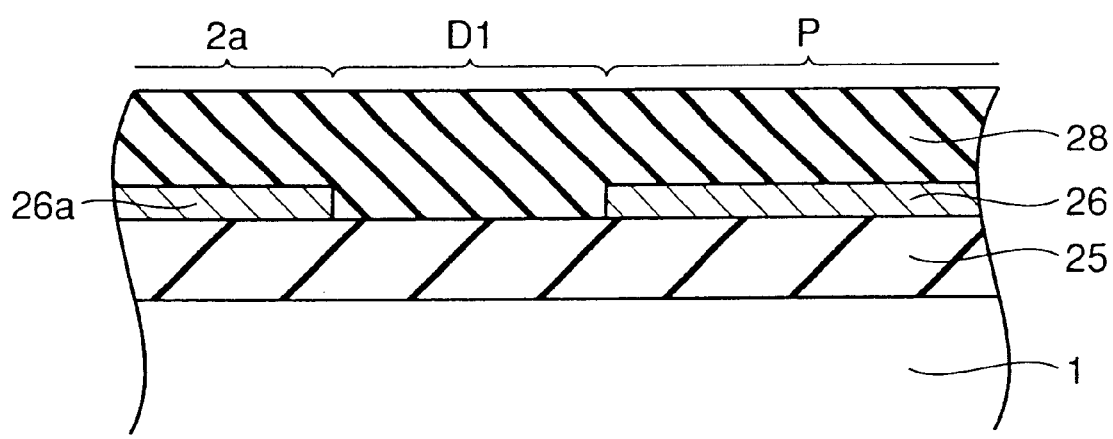
FIG. 13 is a cross section view corresponding to the cross section line V—V shown in FIG. 6 in the second embodiment.

Thereby, the region D1, which corresponds to the peripheral dicing line pattern region 23a, is formed (patterned), as shown in FIG. 13, between, for example, the last chip formation region 2a, in the X direction located in the outermost periphery shown in FIG. 6, and the wafer outer peripheral region P.

Then, the region D1 is positioned in the region to be cut by the dicing, which is provided in a region outside of the chip formation region 2a. This region D1 has a width sufficient for dicing (several tens of a μm or more) and the conductive layer does not remain in this region D1. Accordingly, at the time of the dicing of the region to be cut by dicing, no particles resulting from the cutting of the conductive layer scatter off.

As a result of the above, wires can be prevented from forming an electrical short circuit so as to cause a malfunction due to particles resulting from the cutting of the conductive layer which have scattered off or defective chips can be prevented from occurring at the time of wire bonding.

Here, in the above described process, the region 22, which undergoes double exposure, exists as shown in FIG. 10 and a pattern of comparatively large dimensions is arranged as a pattern so that the disadvantages with regard to pattern formation resulting from the double exposure can be avoided.

Third Embodiment

In the third embodiment, another example of a method of manufacturing a semiconductor device including a method of double exposure of a region corresponding to the dicing line in the exposure process is described. First, the reticle used in this method is described.

Figure 14:
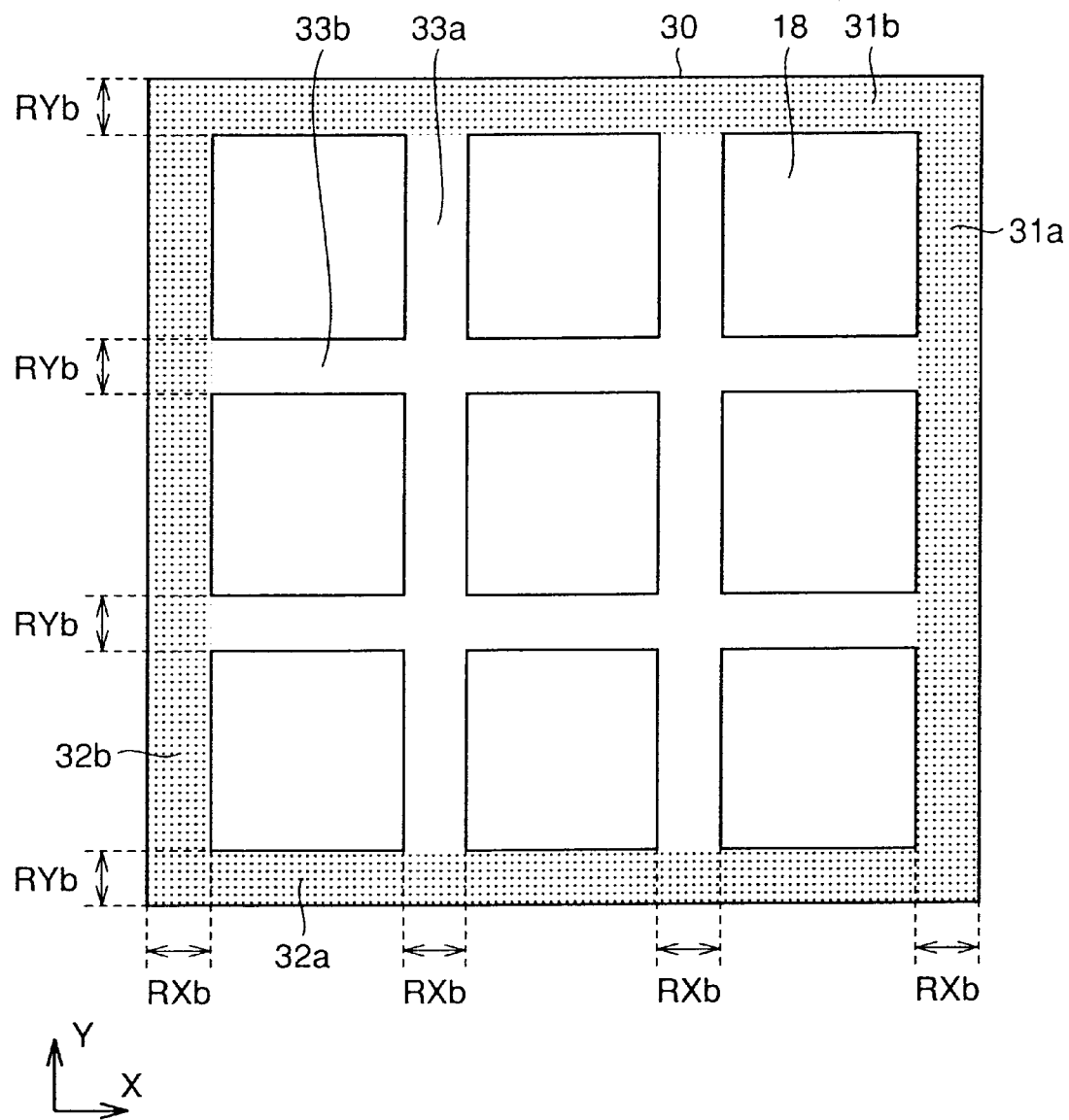
FIG. 14 is a plan view of a reticle used in a process for a semiconductor device according to a third embodiment of the present invention.

As shown in FIG. 14, the reticle 30 is provided with a plurality of chip pattern regions 18, which are partitioned by the dicing line pattern regions 31a, 31b, 32a, 32b, 33a and 33b. Then, the widths of the dicing line pattern regions, which extend in the X direction, are all set at a constant width while the widths of the dicing line pattern regions, which extend in the Y direction, are all set at a constant width.

Concretely, in the dicing line pattern regions, the widths of the peripheral dicing line pattern region 31a, which is positioned in the outermost periphery of the reticle 30, the width of the peripheral dicing line pattern region 32b and the width of the dicing line pattern region 33a, which is located between the chip pattern regions 18, are, respectively, set at the width RXb.

The width of the peripheral dicing line pattern region 31b, the width of the peripheral dicing line pattern region 32a and the width of the dicing line pattern region 33b, which is located between the chip pattern regions 18, are, respectively, set at the width RYb.

Each of the widths RYb, RXb is set so that the width of the region formed at the time of transcription onto the wafer has a sufficient width for dicing (several tens of a μm or more, for example, approximately 60 μm).

In addition, no substantial patterns, such as marks like an alignment mark or TEG, are arranged in the peripheral dicing line pattern regions 31a, 31a, 32a and 32b.

Figure 15:
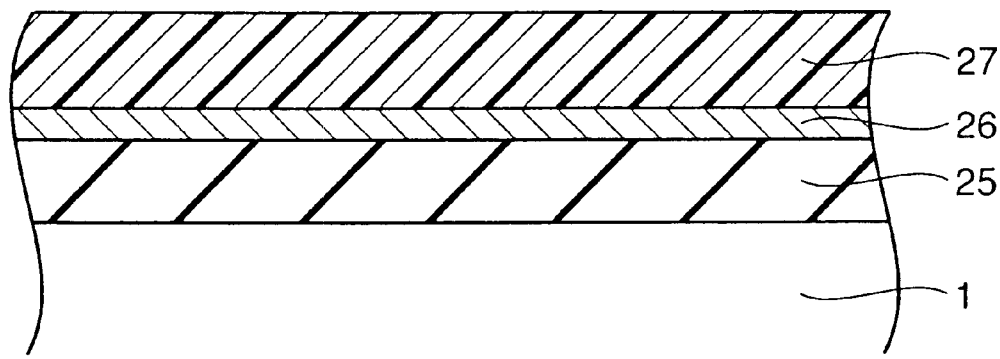
FIG. 15 is a cross section view showing one step of a process for a semiconductor device according to the third embodiment.

Next, a process for a semiconductor device using this reticle 30 is described. First, as shown in FIG. 15, an interlayer insulating film 25 is formed on a silicon substrate 1. A conductive layer 26 for forming a wire layer through, for example, a sputtering method, is formed on the interlayer insulating film 25. A positive type resist 27 is applied to and formed on the conductive layer 26.

Figure 16:
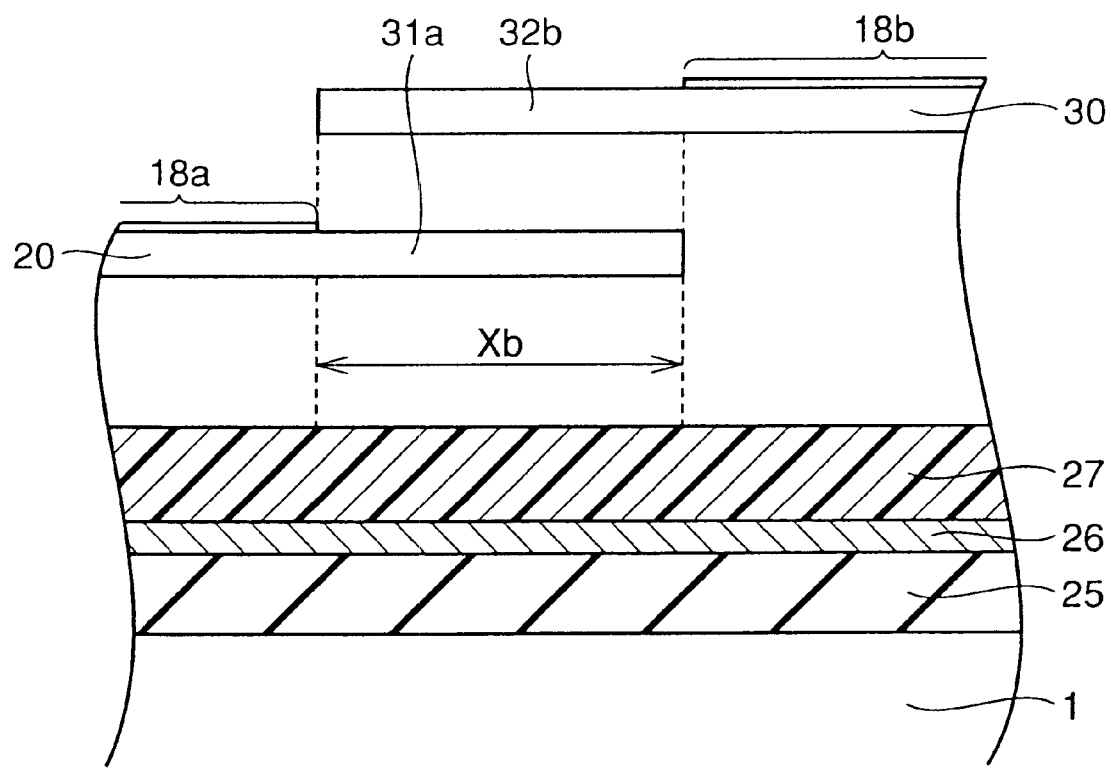
FIG. 16 is a cross section view showing the step which is carried out after the step shown in FIG. 15 in the third embodiment.

Next, the exposure lights sequentially irradiate (are shot at) the resist 27 formed on the wafer via the reticle 30, which is mounted on the exposure unit. At this time, as shown in FIG. 16, the exposure is sequentially carried out according to predetermined positional relationships between one shot and the next shot (for example, in the X direction) wherein the peripheral dicing line pattern region 32b of the reticle 30 in the next shot overlaps, in a plane, the entirety of the peripheral dicing line pattern region 31a of the reticle 30 in the first shot.

Concretely, first, in the first shot, a region which has the width Xb is formed (transcribed) onto the wafer according to the peripheral dicing line pattern region 31a, formed in the reticle 30 and having the width RXb.

In the next shot, a region which has the width Xb is formed (transcribed) onto the wafer according the peripheral dicing line pattern region 32b, formed in the reticle 30 and having the width RXb.

In addition, a region which has the width Xb is formed (transcribed) onto the wafer (not shown) according to the dicing line pattern region 33a, formed in the reticle 30 and having the width RXb.

At this time, the exposure lights irradiate according to the relative positional relationships between the wafer (silicon substrate 1) and the reticle 20 wherein the gap between the chip formation region formed on the wafer according to the chip pattern region 18a, formed in the reticle 30 in one shot, and the chip formation region formed on the wafer according the chip pattern region 18b, formed in the reticle 30 in the next shot, becomes substantially the same as the width Xb of the dicing line region formed on the wafer according to the dicing line pattern region 33a formed in the reticle 20.

On the other hand, the width of the peripheral dicing line pattern region 31a and the width of the peripheral dicing line pattern region 32b both have the width RXb, which is substantially the same as the width RXb of the dicing line pattern region 33a. Accordingly, in order to gain the above described positional relationships, as shown in FIG. 16, the peripheral dicing line pattern region 32b is required to be set so as to have the positional relationships wherein it overlaps, in a plane, the entirety of the peripheral dicing line pattern region 31a. Though this description relates to the X direction, the same description is applicable to the Y direction.

Figure 17:
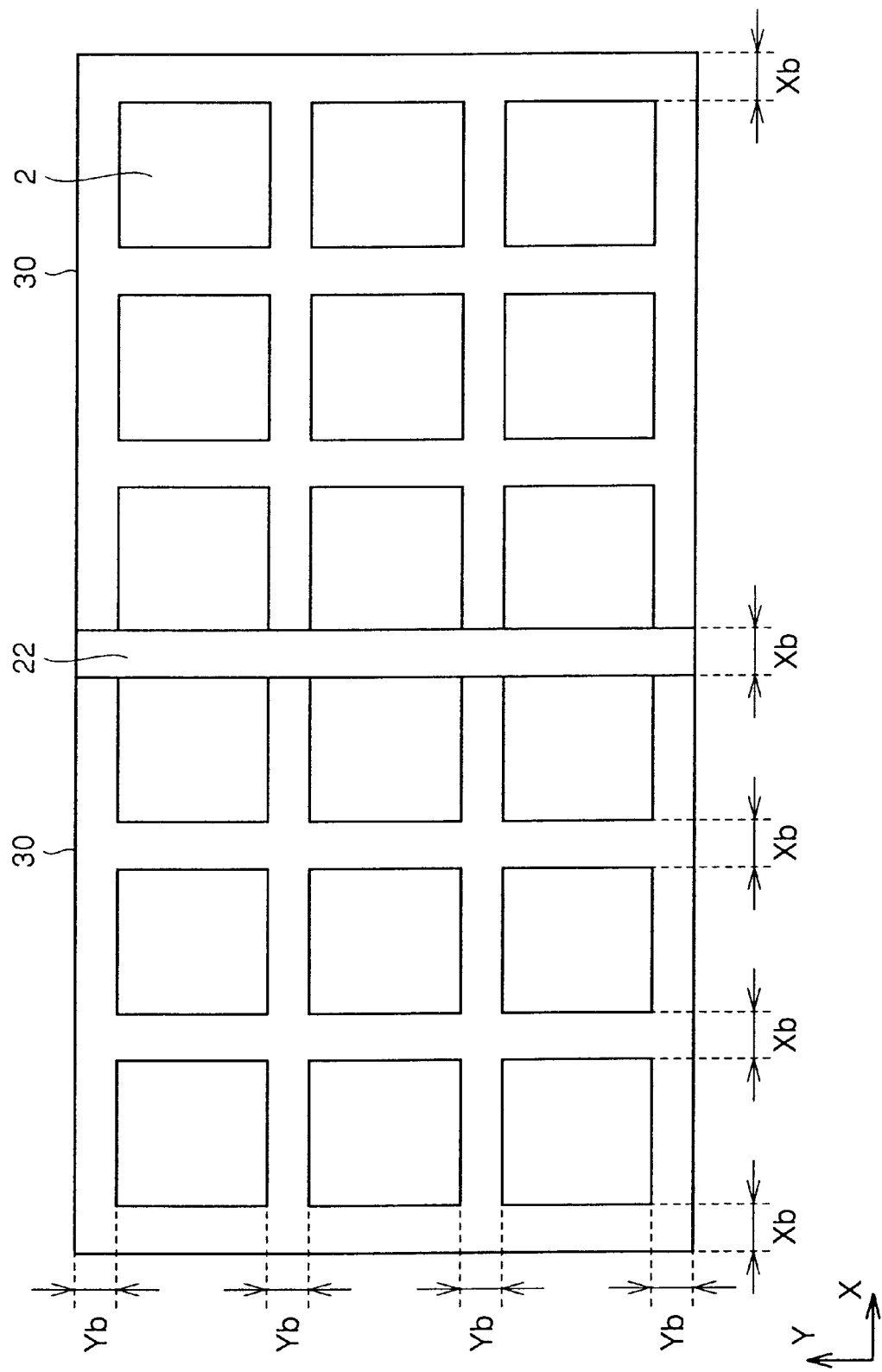
FIG. 17 is a plan view showing chip formation regions and dicing line regions formed in a wafer in the third embodiment.

In this manner, the exposure lights sequentially irradiate the resist formed on the wafer so that the chip formation regions 2 and the dicing line regions are formed on the wafer as shown in FIG. 17. The region 22 shown in FIG. 17 is a region that the exposure light has irradiated twice (double exposure) by carrying out the irradiation according to positional relationships wherein the entireties of the peripheral dicing line pattern regions overlap, in a plane, at the time when exposure light irradiates according to one shot and the next shot, respectively.

Figure 18:
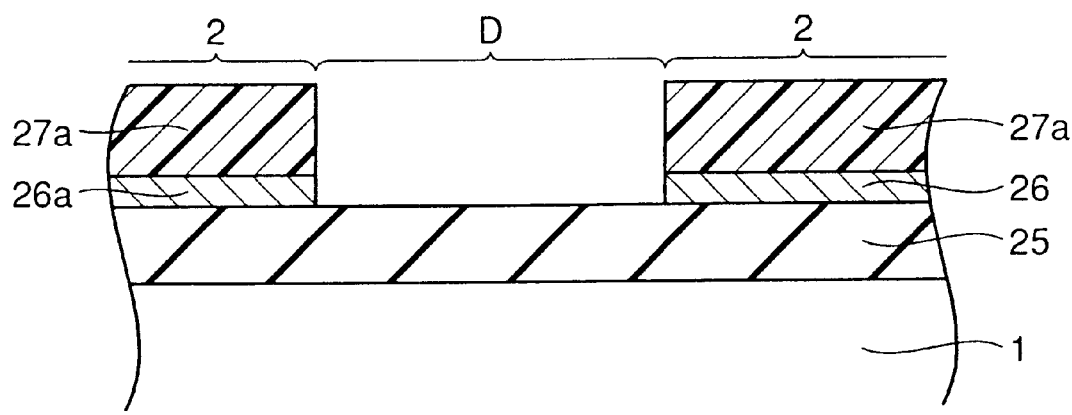
FIG. 18 is a cross section view showing the step which is carried out after the step shown in FIG. 16 in the third embodiment.

No resist remains in the part irradiated by the exposure light because of the positive type resist 27. Accordingly, through the development process, as shown in FIG. 18, the resist in the part corresponding to the region D, which has the width Xb, is removed and a A resist pattern 27a is formed. By carrying out etching on the conductive layer 26 using the resist pattern 27a as a mask, the wire layer 26a is formed. Another that, the resist pattern 27a is removed.

Figure 19:
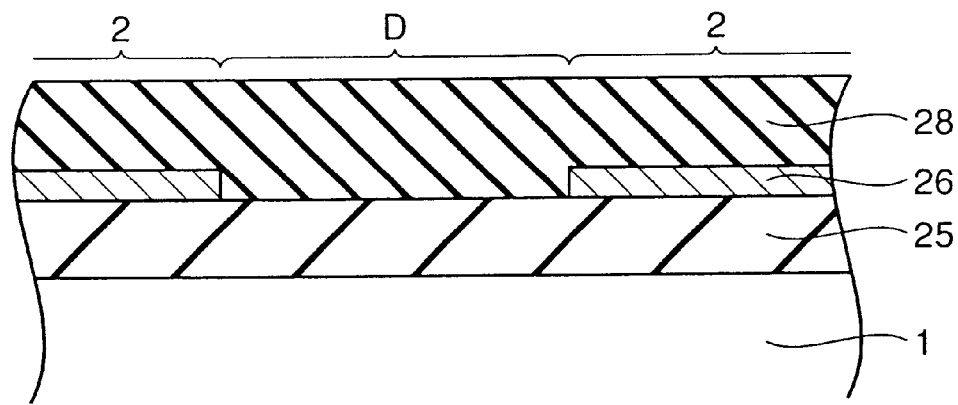
FIG. 19 is a cross section view showing the step which is carried out after the step shown in FIG. 18 in the third embodiment.

Next, as shown in FIG. 19, an interlayer insulating film 28 is formed through, for example, a CVD method so as to cover the wire layer 26a. In this manner, a semiconductor device is formed.

In the above described process for a semiconductor device, as shown in FIGS. 16 and 19, no conductive layer 26 remains in the region D between the chip formation region formed on the wafer according to the chip pattern region 18a in the first shot and the chip formation region formed on the wafer according to the chip pattern region 18b in the next shot. Accordingly, no particles resulting from the cutting of the conductive layer 26 scatter off at the time of the dicing of the two chip formation regions.

Then, as described above, all of the widths of the dicing line pattern regions extending in the X direction formed in the reticle 30 shown in FIG. 14 are set at a constant width RYb while all of the widths of the dicing line pattern regions extending in the Y direction are also set at a constant width RXb. Then, these widths RXb and RYb are set so that the widths formed (patterned) at the time of transcription of the dicing line pattern regions onto the wafer have sufficient width for dicing (several tens of a $\mu$m or more).

Figure 20:
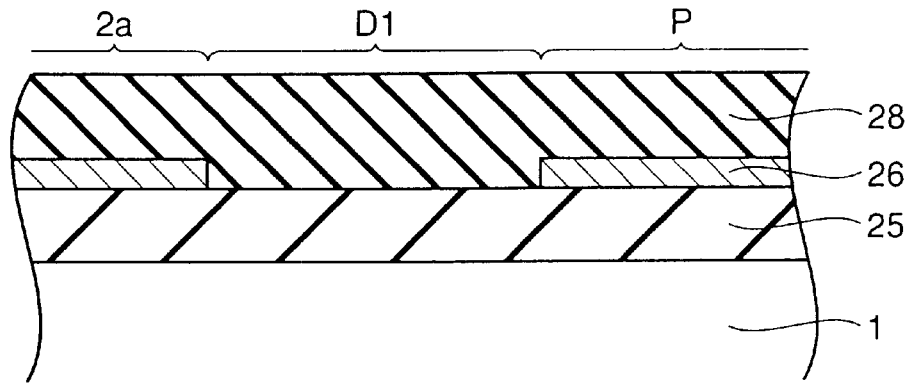
FIG. 20 is a cross section view corresponding to the cross section line V—V shown in FIG. 6 in the third embodiment.

Thereby, the region D1 which corresponds to the peripheral dicing line pattern region 31a is formed (patterned), as shown in FIG. 20, between, for example, the last chip formation region in the X direction located in the outermost periphery shown in FIG. 6 and the wafer outer peripheral region P.

Then, the region D1 is located in the region that is cut by the dicing and is provided in the region outside of the chip formation regions 2a. This region D1 has a width sufficient (several tens of a $\mu$m or more) for dicing and no conductive layer remains in this region D1. Accordingly, no particles resulting from the cutting of the conductive layer scatter off at the time of the dicing of the region which is cut by the dicing.

As a result of the above, at the time of wire bonding wires can be prevented from forming an electrical short circuit due to the particles resulting from the cutting of the conductive layer which have scattered off so as to cause a malfunction and defective chips can be prevented from being generated.

In addition, since marks such as an alignment mark, TEG, or the like, are not arranged in the peripheral dicing line pattern regions 31a, 31b, 32a and 32b, no disadvantages occur due to the double exposure of this part.

Fourth Embodiment

In the fourth embodiment, a spot light of an exposure light is irradiated on the region between the chip formation regions and the wafer outer peripheral region in the exposure step.

Figure 21:
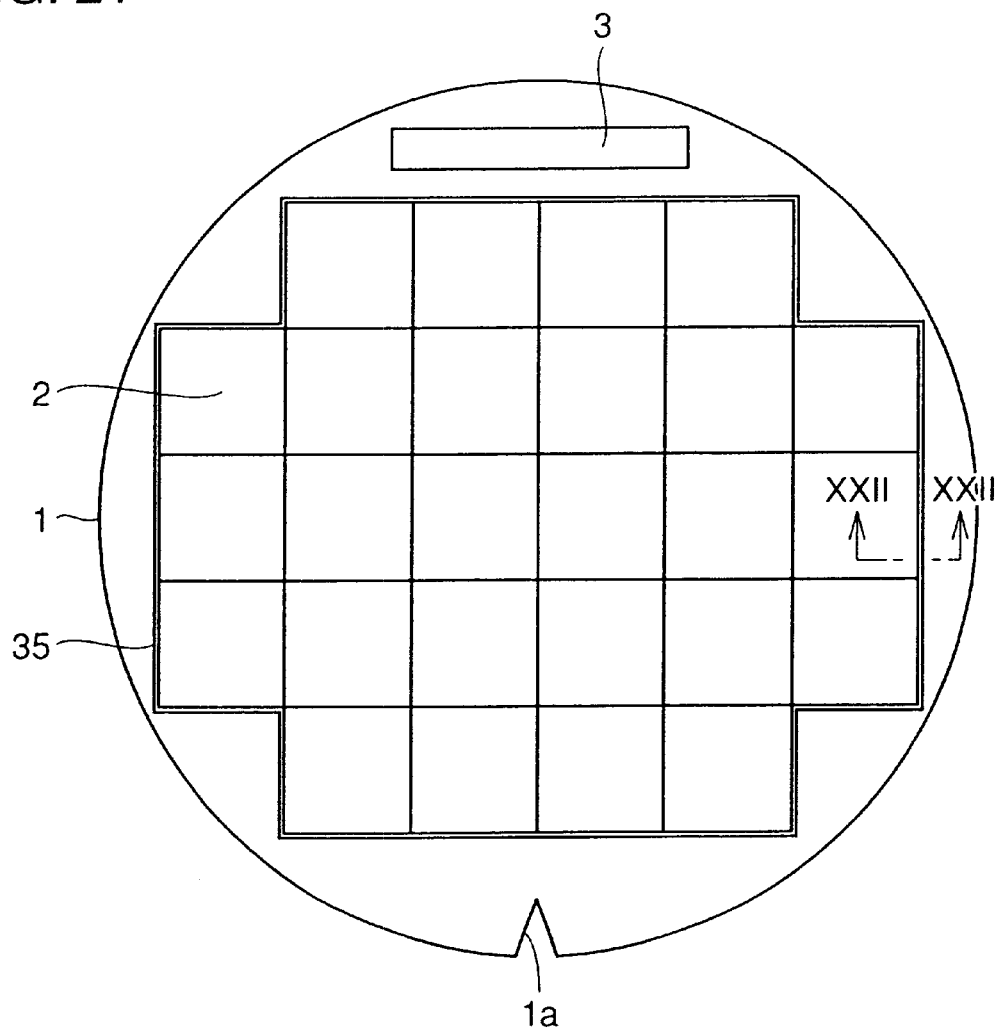
FIG. 21 is a plan view showing chip formation regions and dicing line regions formed in a wafer formed through a process for a semiconductor device according to a fourth embodiment of the present invention.

First, after the step shown in FIG. 8 described in the second embodiment, an exposure light is sequentially irradiated onto the wafer by using, for example, a conventional reticle. After that, the optical system, such as lens provided in the exposure unit, is adjusted so that the spot light of the light source of the exposure unit can be irradiated onto the wafer. Then, as shown in FIG. 21, a spot light is irradiated along the border part between the chip formation region 2 located in the outermost periphery and the wafer outer peripheral region P located in the outside of the chip formation region 2 so as to expose the part which becomes the region 35 that is cut by the dicing.

As for the size of the spot light, the width of the region 35 which is cut by the dicing is required to be set at a size that has a width sufficient for dicing. No resist remains in the part where the spot light of the exposure light is irradiated because the resist 27 is of a positive type.

Figure 22:
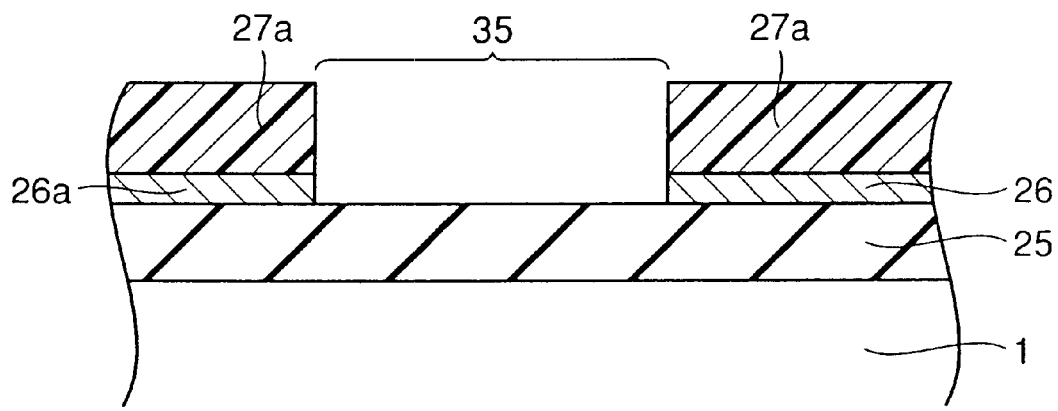
FIG. 22 is cross section view along the cross section line XXII—XXII, shown in FIG. 21, which shows one step of a process for a semiconductor device in the fourth embodiment.

Thereby, through the development process, the resist is removed from the part which corresponds to the region 35 cut by the dicing and a resist pattern 27a is formed as shown in FIG. 22. By carrying out etching on the conductive layer 26 using this resist pattern 27a as a mask, a wire layer 26a is formed. After that, the resist pattern 27a is removed.

Figure 23:
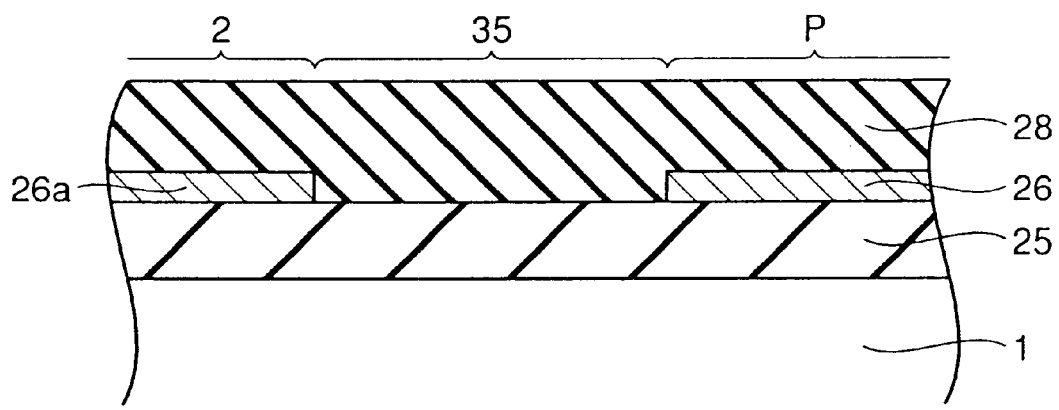
FIG. 23 is a cross section view showing the step which is carried out after the step shown in FIG. 22 in the fourth embodiment.

Next, as shown in FIG. 23, an interlayer insulating film 28 is formed through, for example, a CVD method so as to cover the wire layer 26a. In this manner, a semiconductor device is formed. Here, FIGS. 22 and 23 show the cross sectional structure, which corresponds to the cross section line XXII—XXII shown in FIG. 21, in each step.

In the above described process for a semiconductor device, the part which becomes the region 35 that is cut by the dicing is exposed to the spot light irradiated along the border parts between the chip formation regions 2 located in outermost periphery and the wafer outer peripheral region P. In addition, as for the size of the spot light, the width of the region 35 which is cut by dicing is set at the size which has a width sufficient for dicing.

Thereby, as shown in FIG. 21, the region 35 which has a width sufficient for dicing is formed in the wafer. In addition, no conductive layer 26 remains in the region 35 that is cut by dicing. Thereby, no particles resulting from the cutting of the conductive layer 26 scatter off at the time of the dicing of this region 35.

As a result, wires can be prevented from forming an electrical short circuit due to the particles resulting from the cutting of the conductive layer which have scatter off so as to cause a malfunction and defective chips can be prevented from being generated.

Fifth Embodiment

In the fifth embodiment, a method of manufacturing a semiconductor device wherein a dedicated reticle is applied to the wafer outer peripheral region is described.

Figure 24:
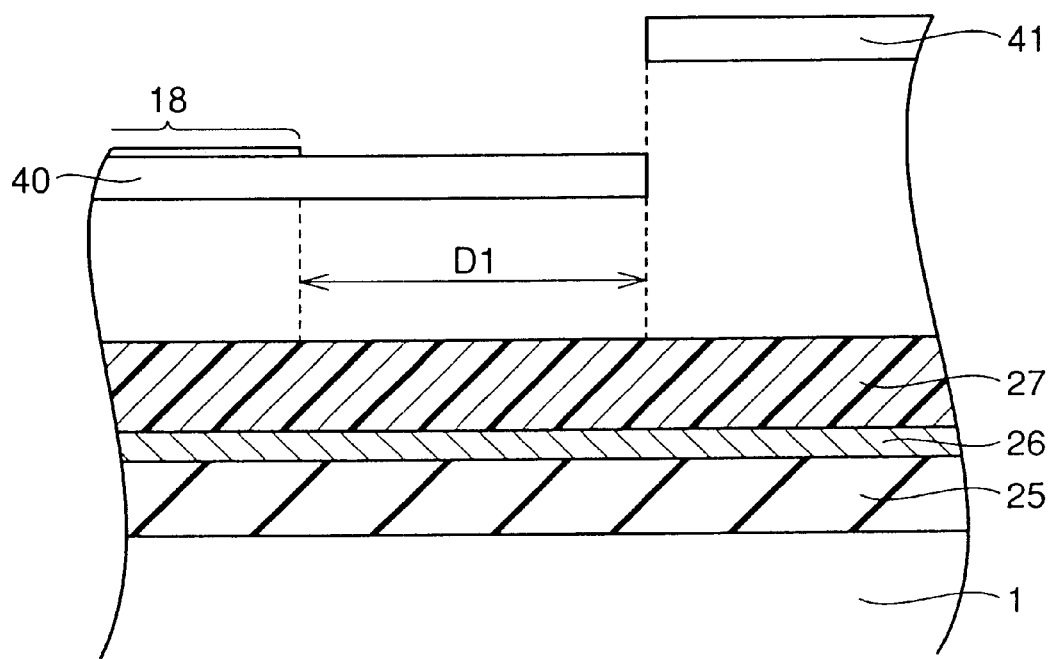
FIG. 24 is cross section view along the cross section line XXIV—XXIV, shown in FIG. 25, which shows one step of a process for a semiconductor device according to a fifth embodiment of the present invention.

First, after the step shown in FIG. 8, which is described in the second embodiment, an exposure light sequentially carries out irradiation by using, for example, a conventional reticle, or a reticle as described in the second or third embodiment, as the reticle 40 as shown in FIG. 24.

Figure 25:
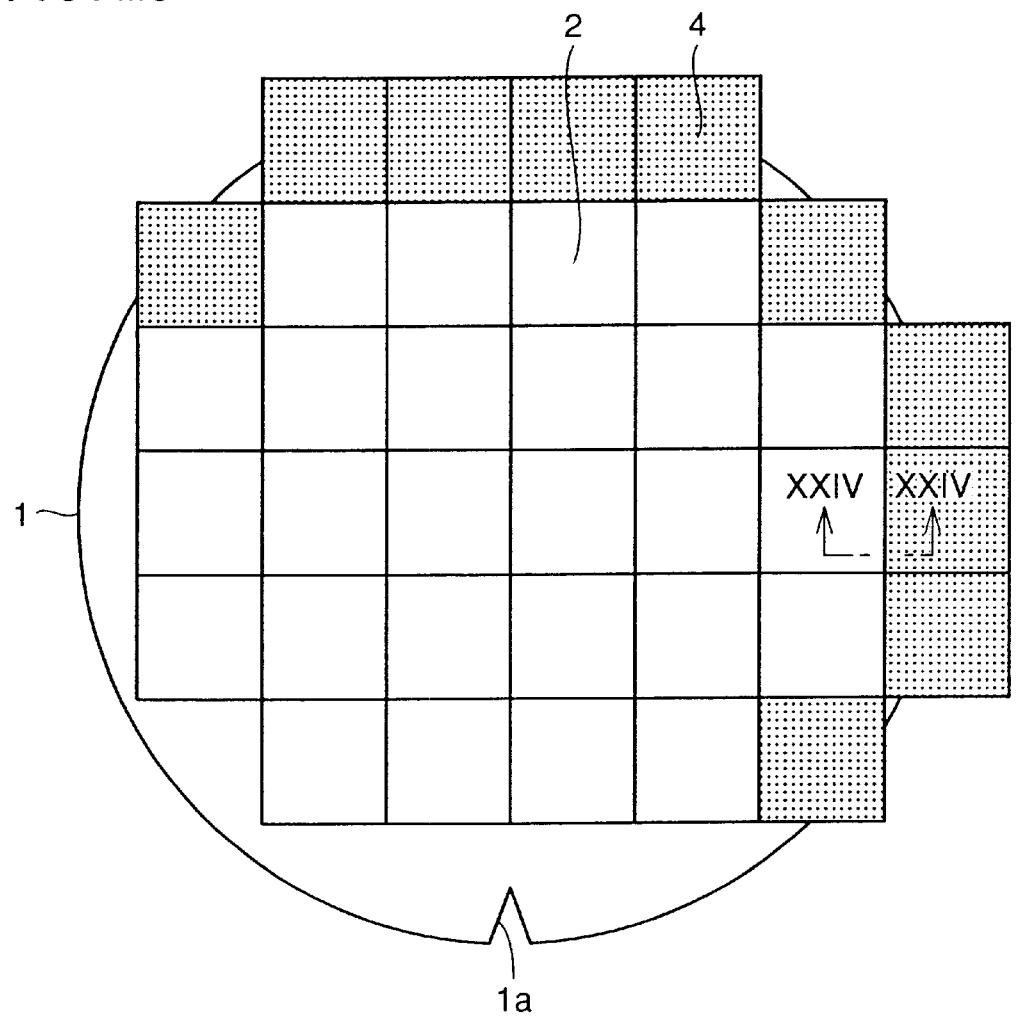
FIG. 25 is a plan view showing the positional relationships between chip formation regions and a pattern resulting from a dummy reticle in the fifth embodiment.

Next, a dummy reticle 41, which is the same size as the reticle 40, is mounted on the exposure unit. Then, as shown in FIGS. 24 and 25, an exposure light carries out an irradiation in the wafer outer peripheral region P via the dummy reticle 41. Here, FIG. 25 shows the relative positional relationships between the chip formation region 2 formed on the wafer and the transcription region (dummy shot) 4 according to the dummy reticle 41.

No pattern is particularly formed in the dummy reticle 41. Therefore, an exposure light irradiates the entire region of the resist 27 which is located in the wafer outer peripheral region P. No resist remains in the region where the exposure light irradiates because the resist 27 is of a positive type.

Figure 26:
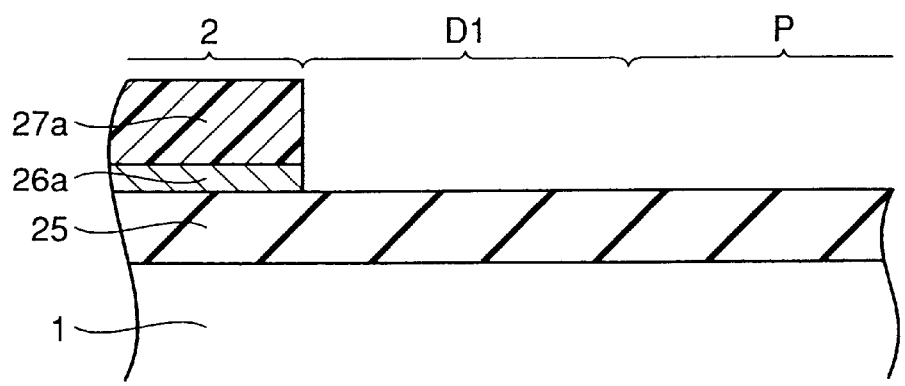
FIG. 26 is a cross section view showing the step which is carried out after the step shown in FIG. 24 in the fifth embodiment.

Thereby, through the development process, the resist in the region D1 which corresponds to the peripheral dicing line pattern region of the reticle 40 and the part which corresponds to the wafer outer peripheral region P is removed and a resist pattern 27a is formed as shown in FIG. 26. By carrying out etching on the conductive layer 26 using this resist pattern 27a as a mask, a wire layer 26a is formed. After that, the resist pattern 27a is removed.

Figure 27:
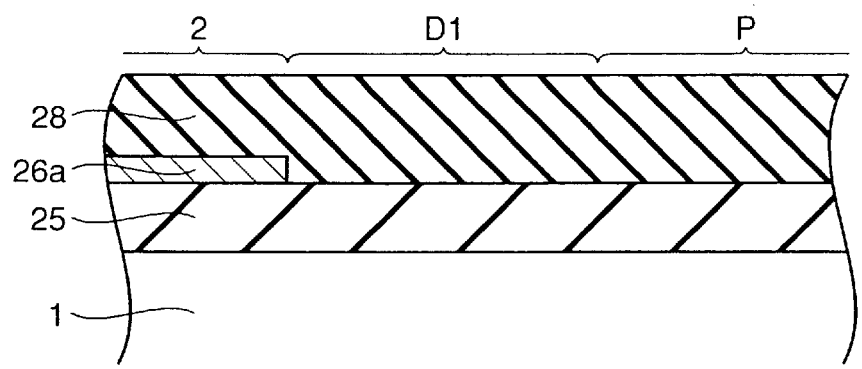
FIG. 27 is a cross section view showing the step which is carried out after the step shown in FIG. 26 in the fifth embodiment.

Next, as shown in FIG. 27, an interlayer insulating film 28 is formed through, for example, a CVD method so as to cover the wire layer 26a. In this manner, a semiconductor device is formed. Here, FIGS. 24, 26 and 27 show the cross sectional structure which corresponds to the cross section line XXIV—XXIV shown in FIG. 25 in each step.

According to the above described process for a semiconductor device, transcription is carried out on the wafer outer peripheral region by using a dummy reticle wherein no pattern is formed and, thereby, no conductive layer 26 remains in the region outside of the chip formation regions 2 located in the outermost periphery (region D1 and wafer outer peripheral region P).

Thereby, no conductive layer 26 remains in the region that is cut by dicing and is provided in the region outside of chip formation regions 2 located in the outermost periphery. Accordingly, no particles resulting from the cutting of the conductive layer 26 scatter off at the time of the dicing of the region that is cut by dicing.

As a result, wires can be prevented from forming an electrical short circuit due to the particles resulting from the cutting of the conductive layer which have scatter off and defective chips can be prevented from occurring at the time of wire bonding.

Sixth Embodiment

In the sixth embodiment, a semiconductor device, wherein the size of the patterns that are arranged in the dicing line regions such as marks like an alignment mark is limited, is described.

Figure 28:
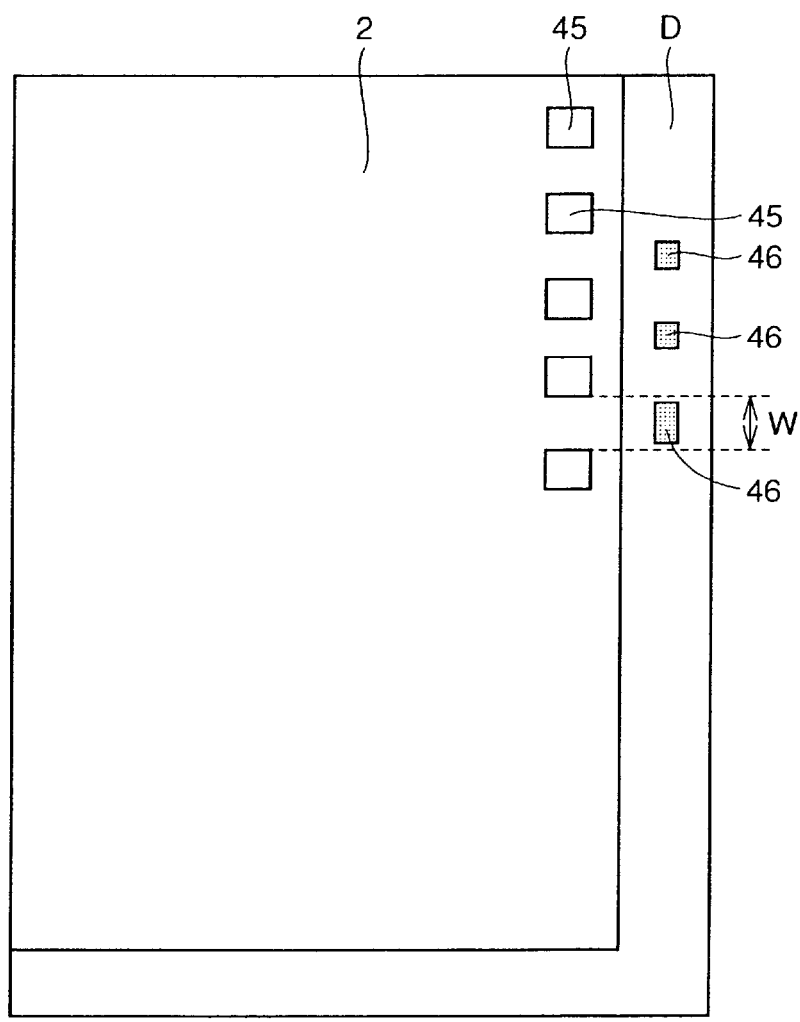
FIG. 28 is a plan view showing chip formation regions and dicing line regions formed in a wafer according to a sixth embodiment of the present invention.

FIG. 28 is a figure showing one of the chip formation regions 2 formed on the wafer. As shown in FIG. 28, a plurality of pad electrodes 45 made of, for example, aluminum are provided in the chip formation region 2 in order to take out a signal from the chip. Then, in comparison with the gap W between the neighboring pad electrodes 45, the size of a pattern 46, such as an alignment mark or a TEG, formed in the dicing line region D is set smaller than the gap W.

During the assembly process, each of the chip formation regions 2 which is formed on the wafer is cut off by dicing the dicing line region D. In general, the pattern 46, such as an alignment mark provided in the dicing line region D, also undergoes dicing at the time of the dicing of the dicing line region D so that the particles resulting from the cutting scatter off. Since such a pattern 46 is formed of a conductive material wires form, in some cases, an electrical short circuit due to the particles resulting from the cutting of the conductive material which have scattered off at the time the bonding of the wires onto the pad electrodes 45 in the wire bonding process.

In this semiconductor device the pattern 46 is formed so as to be smaller than the gap W between the neighboring patterns 46. Thereby, even in the case that the particles resulting from the cutting of the pattern 46 scatter off at the time of dicing, the size of the particles is smaller than the gap W. As a result, wires which are bonded onto the neighboring pad electrodes 45, respectively, do not form an electrical short circuit due to the particles and, thereby, malfunctions and defective chips can be prevented from occurring.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device having:

a step of forming a conductive layer on a wafer as semiconductor substrate;

a resist application step of applying a resist on said conductive layer;

an exposure step of sequentially irradiating an exposure light onto said resist located in a plurality of chip formation regions for forming, respectively, semiconductor chips in said wafer via a predetermined reticle;

a development step of forming a resist pattern for patterning said conductive layer by developing said resist after said exposure step; and a step of forming a conductive region by etching said conductive layer using said resist pattern as a mask, wherein said exposure step comprises a step of providing a resist-free region which is cut by dicing and is provided in a region outside of the chip formation regions and located in a wafer outermost periphery adjacent said chip formation regions.

2. The method of manufacturing a semiconductor device according to claim 1, wherein a negative resist is used as said resist in said resist application step; and no exposure light in said exposure step irradiates the region outside of the chip formation regions located in said outermost periphery.

3. The method of manufacturing a semiconductor device according to claim 1, wherein in said exposure step, a spot of said exposure light irradiates along a border between the chip formation regions located adjacent said outermost periphery and the region outside of the chip formation region located in said outermost periphery after said exposure light sequentially irradiates said resist located in said plurality of chip formation regions.

4. The method of manufacturing a semiconductor device according to claim 1, wherein a dummy reticle is used during an exposure in said exposure step during which no pattern is formed on the region outside of the chip formation regions located in said outermost periphery.

5. The method of manufacturing a semiconductor device according to claim 1, wherein during said exposure step, said predetermined reticle provides peripheral dicing line pattern regions having a pattern width for providing regions to be cut by dicing, said peripheral dicing line pattern regions are formed along the outermost periphery, and during sequential exposures using said predetermined reticle, in one exposure and in an immediately following exposure, the exposures are carried out in positions wherein said peripheral dicing line pattern regions overlap at least partially in a plane.

6. The method of manufacturing a semiconductor device according to claim 5, wherein said peripheral dicing line pattern region have substantially equal widths in said predetermined reticle, and in one exposure and in an immediately following exposure, the exposures are carried out in positions wherein said peripheral dicing line pattern regions completely overlap in a plane.

7. The method of manufacturing a semiconductor device according to claim 6, wherein the resist pattern is substantially not formed in said peripheral dicing line pattern regions.

* * * * *